United States Patent [19]
Omura et al.

[11] Patent Number: 5,962,893
[45] Date of Patent: *Oct. 5, 1999

[54] SCHOTTKY TUNNELING DEVICE

[75] Inventors: Ichiro Omura; Takashi Shinohe, both of Yokohama, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/586,277

[22] Filed: Jan. 16, 1996

[30] Foreign Application Priority Data

Apr. 20, 1995 [JP] Japan .................................. 7-095642

[51] Int. Cl.$^6$ .............................. H01L 29/78; H01L 29/47
[52] U.S. Cl. ........................ 257/329; 257/330; 257/331; 257/472; 257/77; 257/902; 257/155; 257/289; 257/284; 257/403; 257/263; 257/264; 257/266; 257/267; 257/269
[58] Field of Search .................................. 257/260, 403, 257/471–472, 155, 77, 289, 902, 330, 331, 329, 280, 284, 263–269

[56] References Cited

U.S. PATENT DOCUMENTS

| | | | |
|---|---|---|---|
| 5,040,034 | 8/1991 | Murakami et al. | 257/471 |
| 5,049,953 | 9/1991 | Mihara et al. | 257/409 |
| 5,396,085 | 3/1995 | Baliga | 257/260 |
| 5,545,905 | 8/1996 | Muraoka et al. | 257/268 |

OTHER PUBLICATIONS

S. M. Sze, Physics of Semiconductor Devices, 2nd ed., 1981, pp. 245–304.

C. J. Koeneke, et al., "Shottky Mosfet for VLSI", IEDM 1981, (pp. 367–370).

T. Mochizuki, et al., "An n–Channel MOSFET With Shottky Source and Drain", IEEE Electron Device Letters, vol. EDL–5, No. 4, Apr. 1984, (pp. 108–111).

T. Yachi, et al., "A New Method Utilizing Ti–Silicide Oxidation for the Fabrication of a MOSFET with a Self–Aligned Schottky Source/Drain", IEEE Electron Device Letters, vol. EDL–5, No. 8, Aug. 1983, (pp. 277–279).

Primary Examiner—John Guay
Attorney, Agent, or Firm—Oblon, Spivak, McClelland, Maier & Neustadt, P.C.

[57] ABSTRACT

An n-semiconductor layer is arranged on a low-resistance n-substrate. A drain electrode is in ohmic contact with the n-substrate. A source electrode forms a Schottky junction with the n-semiconductor layer. A gate electrode is arranged adjacent to the source electrode on the n-semiconductor layer through a gate insulating film. When a voltage is applied to the gate electrode to lower the Schottky barrier height at the interface between the source electrode and the n-semiconductor layer, electrons are injected from the source electrode into the n-semiconductor layer, and a current flows in the semiconductor device. A diffusion layer which prevents a decrease in manufacturing time is not required to form in the n-semiconductor layer, and a channel which causes an increase in ON state voltage is not present.

9 Claims, 18 Drawing Sheets

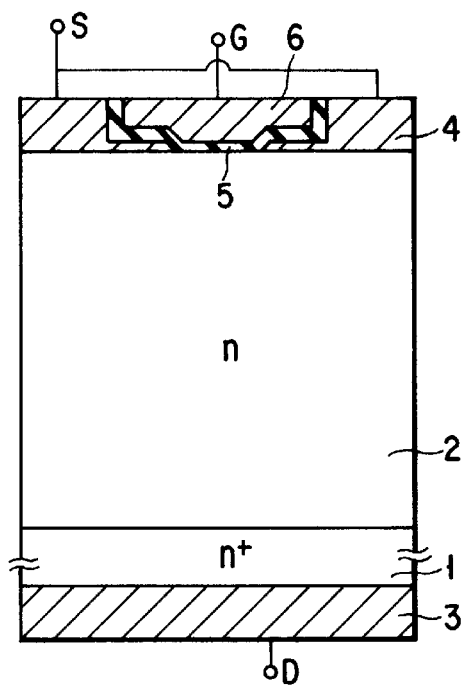
F I G. 5
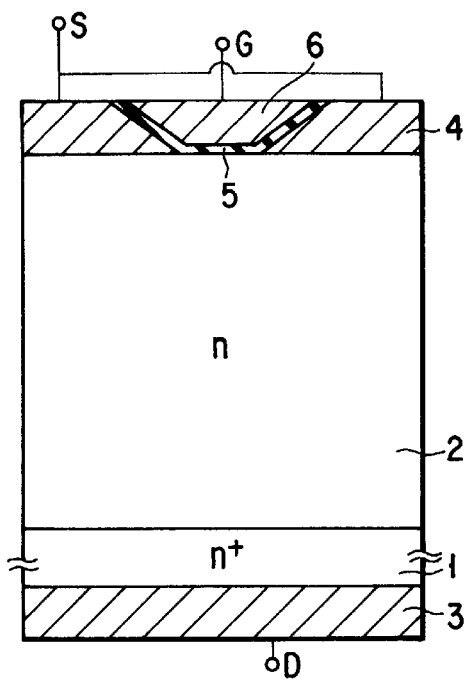
F I G. 6
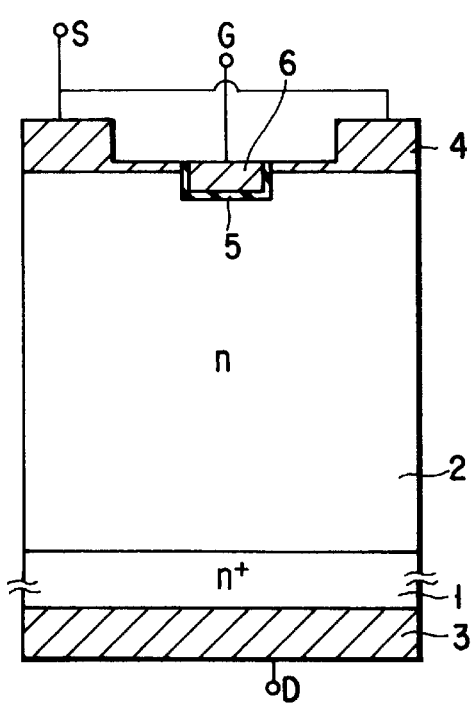
F I G. 7
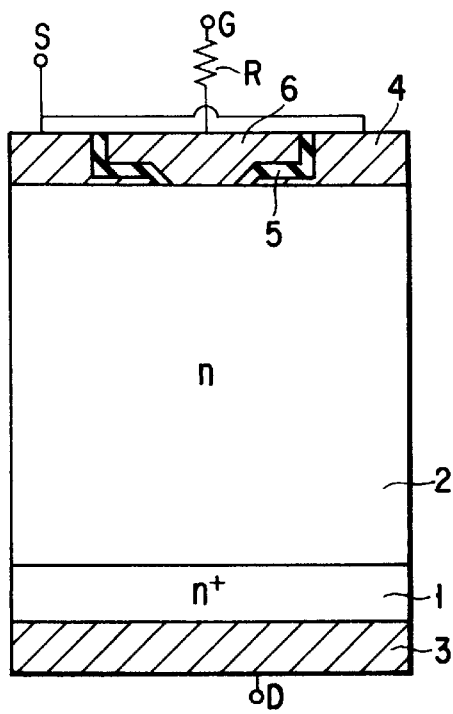
F I G. 8

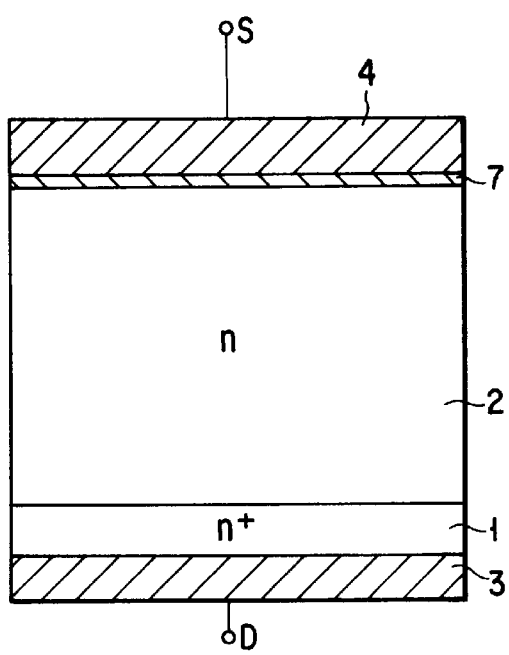
F I G. 13
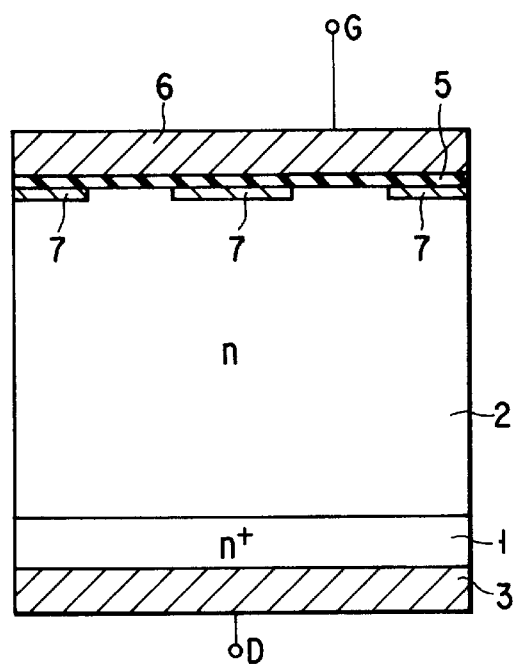
F I G. 14
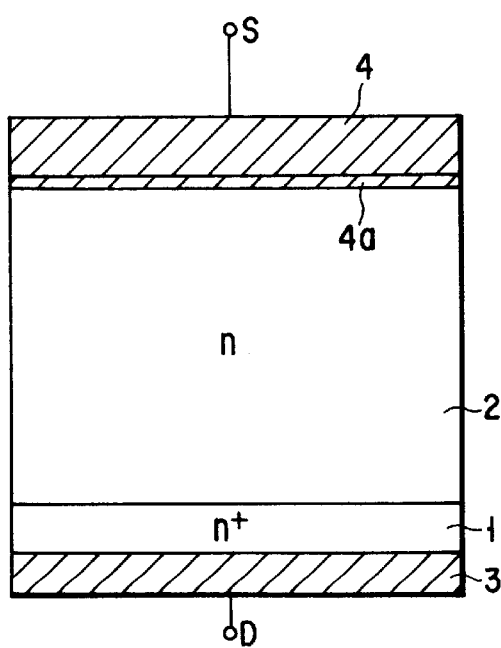
F I G. 16
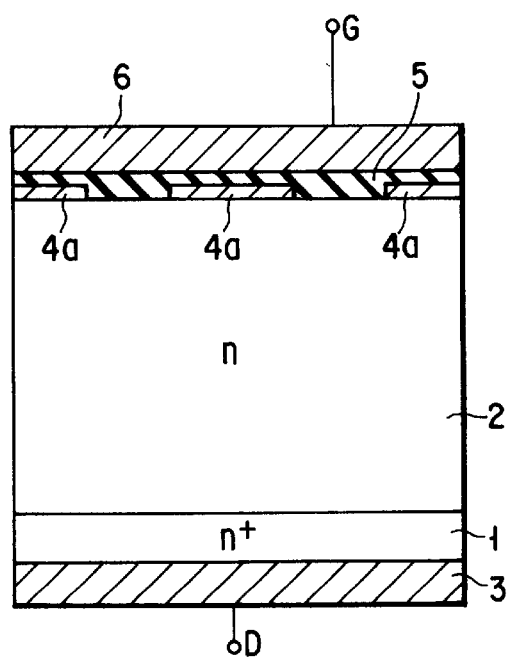
F I G. 17

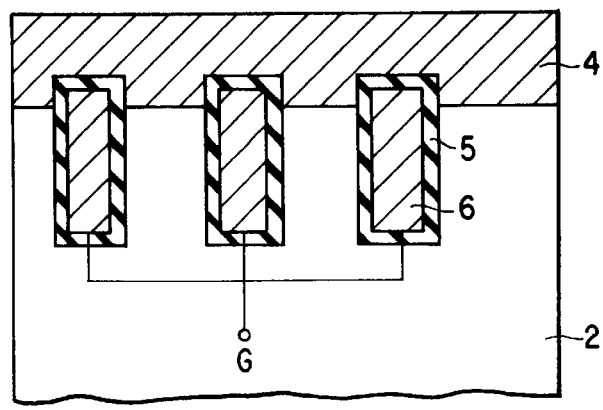
F I G. 2 2
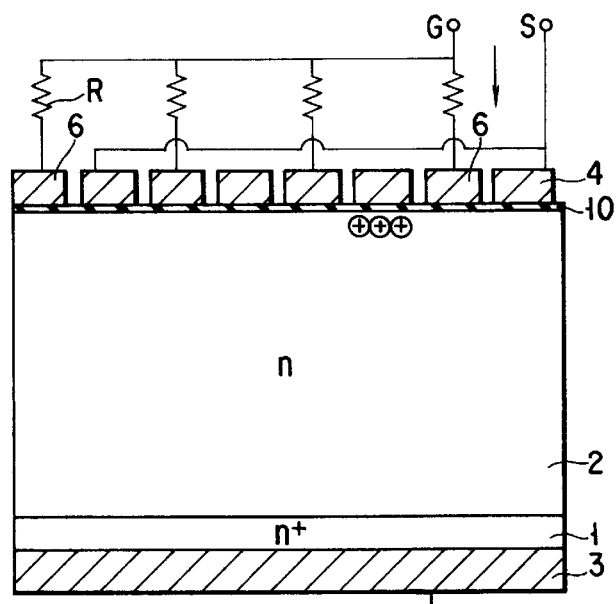
F I G. 2 3
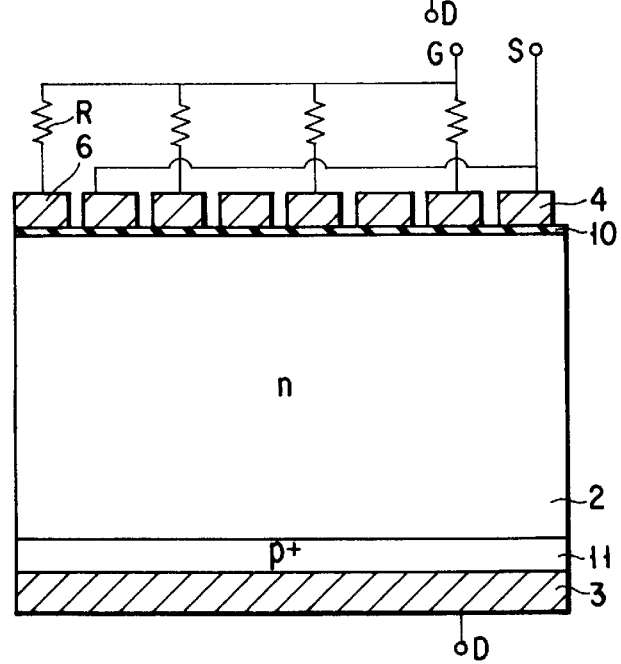
F I G. 2 4

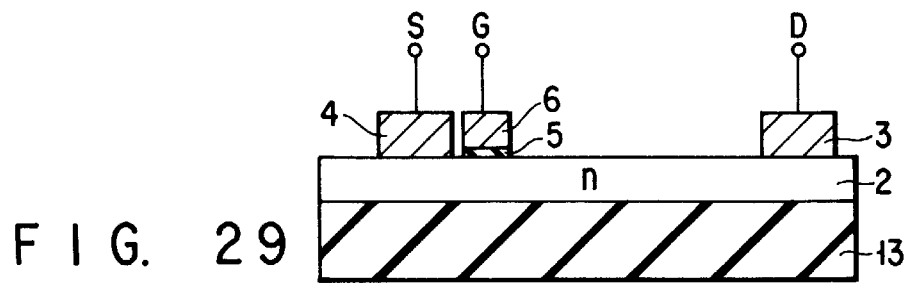
F I G. 29
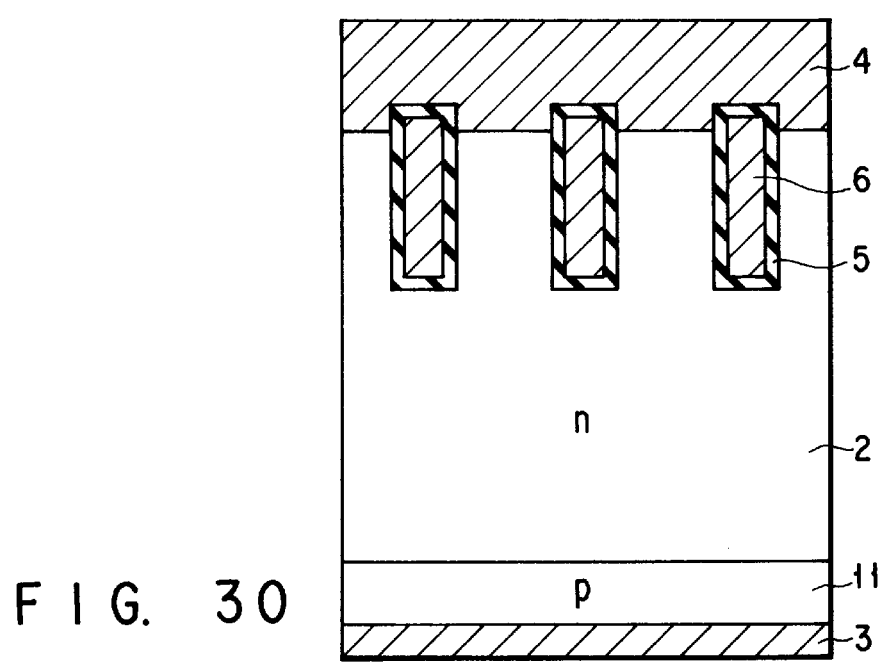
F I G. 30
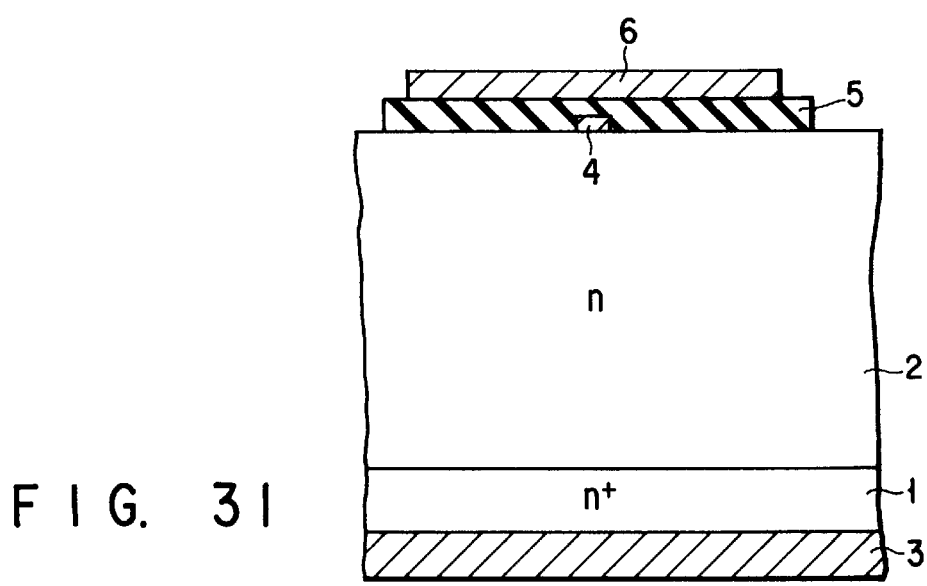
F I G. 31

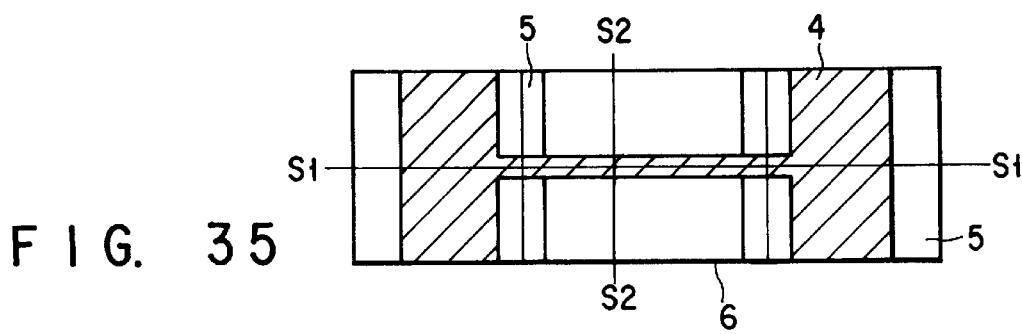
FIG. 35
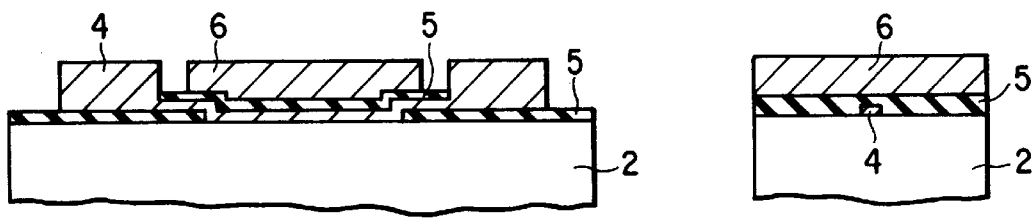
FIG. 36A    FIG. 36B
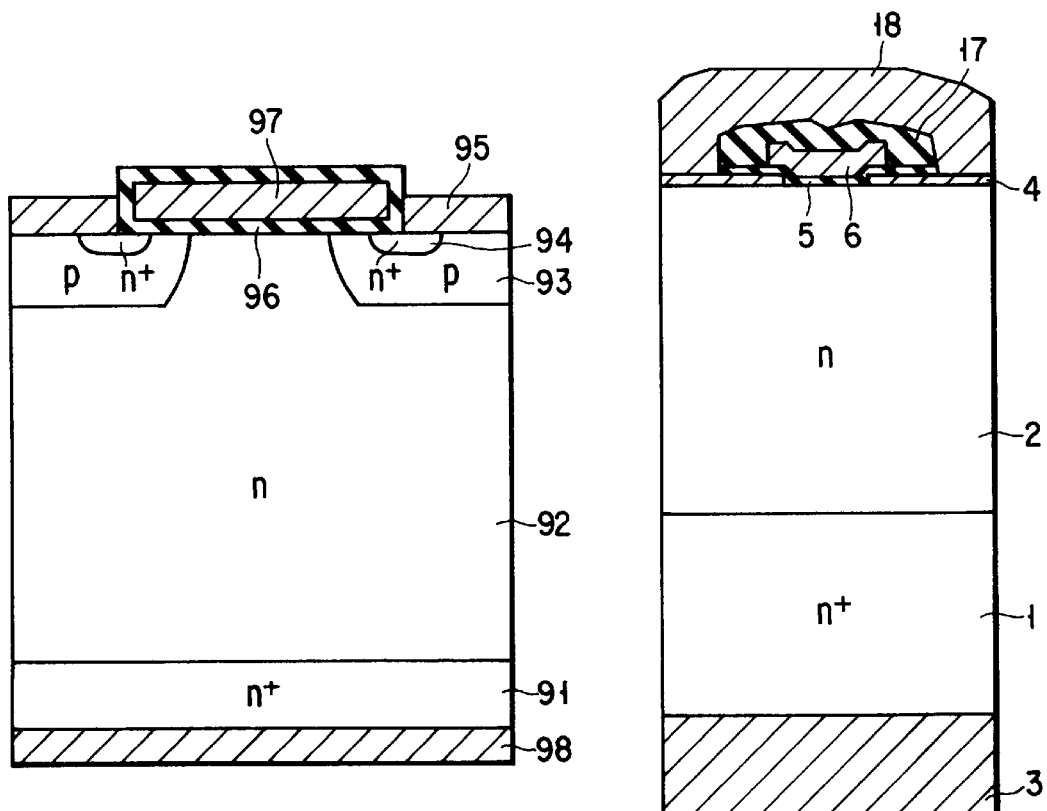
FIG. 37
(PRIOR ART)
FIG. 38

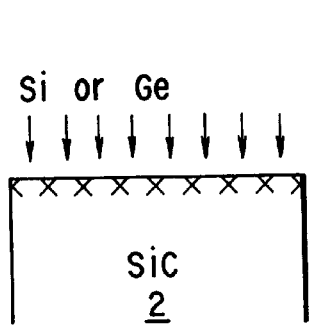
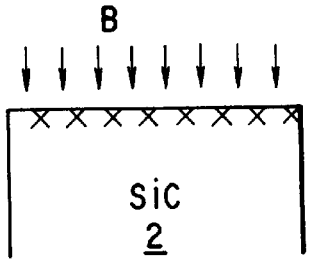
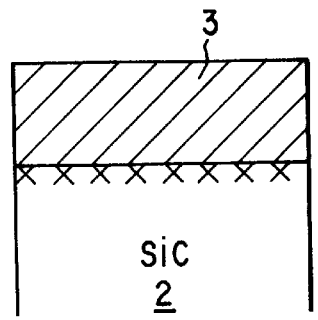
F I G. 46A    F I G. 46B    F I G. 46C
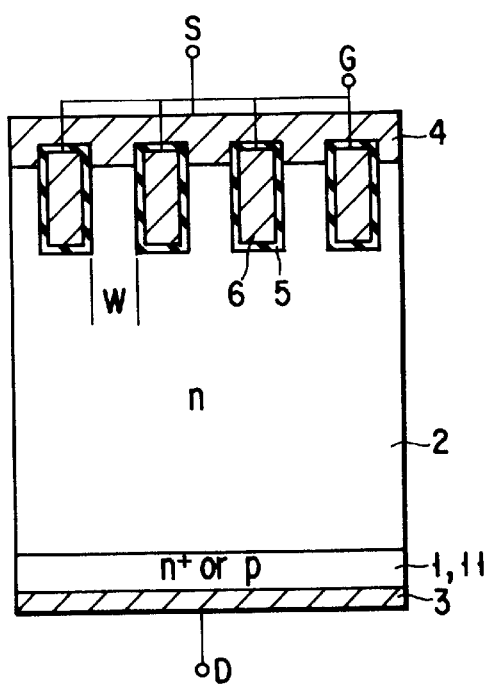
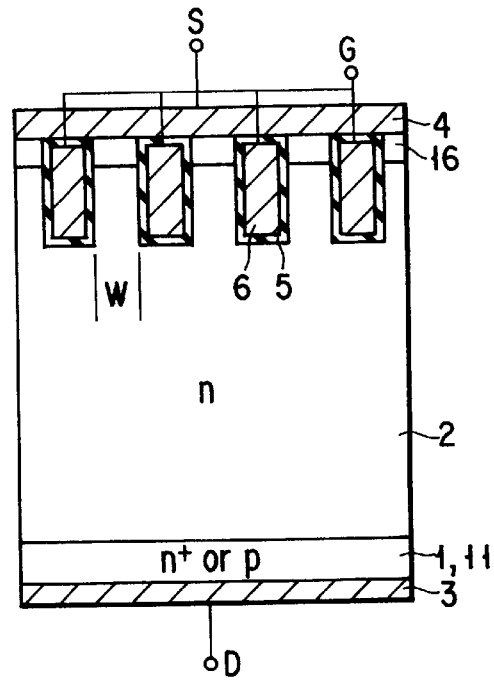
F I G. 47        F I G. 48

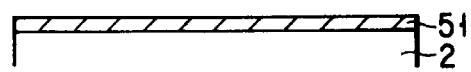
F I G. 52A
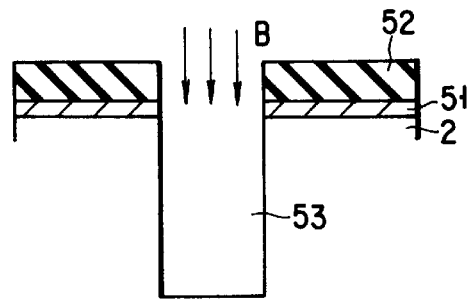
F I G. 52B
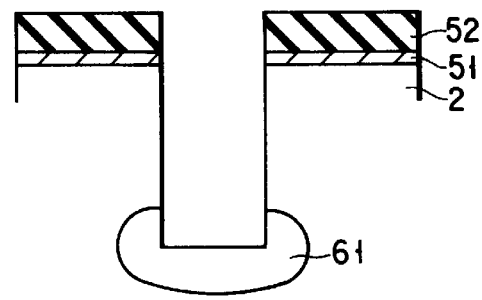
F I G. 52C
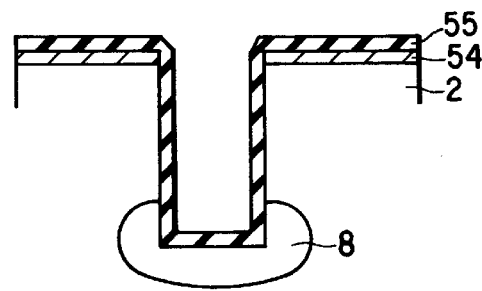
F I G. 52D
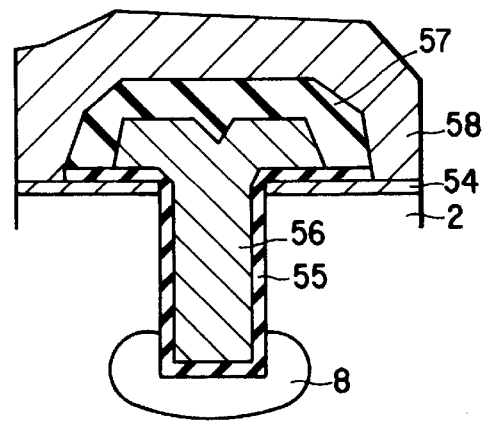
F I G. 52E

SCHOTTKY TUNNELING DEVICE

BACKGROUND OF THE INVENTION

1. Field of the Invention

The present invention relates to a semiconductor device which operates similarly to a semiconductor device having a MOS gate structure such as a MOSFET or an IGBT, and a method of manufacturing the same.

2. Description of the Related Art

Conventionally, semiconductor devices having MOS gate structures have frequently been used as a power device and an RF device. FIG. 37 is a cross sectional view showing a power MOSFET as an example of a conventional power device.

In FIG. 37, reference numeral 92 denotes an n-drift layer. A p-well layer 93 is selectively formed in the surface of the n-drift layer 92, and a low-resistance n-source layer 94 is selectively formed in the surface of the p-well layer 93.

A gate electrode 97 is arranged on the p-well layer 93 between the n-drift layer 92 and the n-source layer 94 through a gate insulating film 96. A source electrode 95 is arranged to contact both the p-well layer 93 and the n-source layer 94. A drain electrode 98 is arranged below the n-drift layer 92 through a low-resistance n-semiconductor layer 91.

In a power MOSFET of this type, the semiconductor layers such as the p-well layer 93 and the n-source layer 94 are formed by diffusing impurities. For example, the p-well layer 93 is formed by diffusing a p-impurity such as boron, and the n-source layer 94 is formed by diffusing an n-impurity such as arsenic.

For this reason, the power MOSFET has the following problems. More specifically, since layer formation by impurity diffusion takes a long period of time, formation of the semiconductor layers such as the p-well layer 93 and the n-source layer 94 takes a long period of time to prolong the manufacturing time of a device. In particular, it is impossible to manufacture a device when a semiconductor made of SiC, CdS, diamond, or the like, in which impurity diffusion is difficult and an impurity ionization rate is low, is used as a bulk material.

Further, in a semiconductor device having a MOS gate structure such as a power MOSFET, a current is caused to flow through a channel generated by control of the gate electrode 97, undesirably generating a channel resistance. Such a channel resistance causes an increase in ON state voltage, so that it is difficult to improve the ON state characteristics. In particular, the channel resistance is increased in SiC and a semiconductor device of this type is hardly realized.

As described above, the conventional power MOSFET has the problem of an increase in manufacturing time of the device because the device is formed by diffusing impurities. In addition, it has the problem of an increase in ON state voltage owing to the presence of the channel resistance.

SUMMARY OF THE INVENTION

The present invention has been made in consideration of the above situation, and has as its object to provide a semiconductor device and a method of manufacturing the same, in which the manufacturing time can be decreased and the ON state characteristics can be improved compared to those in a conventional device.

According to a first aspect of the present invention, there is provided a semiconductor device comprising:

a first semiconductor layer of a first conductivity type;

a first main electrode forming a Schottky junction with the first semiconductor layer;

a second main electrode connected to the first semiconductor layer; and control means for controlling a Schottky barrier height of the Schottky junction, wherein, when the Schottky barrier height is lowered during applying a voltage across the first and second main electrodes, the device is turned on, and a current flows between the first and second main electrodes through the first semiconductor layer in an ON state.

According to a second aspect of the present invention, there is provided a semiconductor device comprising:

a first semiconductor layer of a first conductivity type, the first semiconductor layer consisting of a material selected from a group consisting of SiC, CdS, and diamond;

a first main electrode forming a Schottky junction with the first semiconductor layer;

a second main electrode connected to the first semiconductor layer; and control means for controlling a Schottky barrier height of the Schottky junction, wherein when the Schottky barrier height is lowered during applying a voltage across the first and second main electrodes, the device is turned on, and a current flows between the first and second main electrodes through the first semiconductor layer in the ON state.

According to a third aspect of the present invention, there is provided a semiconductor device comprising:

a first semiconductor layer of a first conductivity type;

a first main electrode having a small area and arranged on the first semiconductor layer;

a second main electrode connected to the first semiconductor layer; and a control electrode having a large area and arranged on the first semiconductor layer and the first main electrode through an insulating film, wherein a current flows between the first and second main electrodes through the first semiconductor layer in an ON state, and a current path below the first electrode is pinched off owing to an inversion layer of a second conductivity type which is induced in the first semiconductor layer upon application of a potential to the control electrode.

In a semiconductor device according to the present invention, the Schottky barrier height at the interface between the first main electrode and the first semiconductor layer is lowered by a control means, e.g., by applying a voltage to a control electrode. With this operation, the semiconductor device is set in the ON state, and a current flows between the first and second main electrodes through the first semiconductor layer. Where the first semiconductor layer is of an n-type, electrons are injected from the first main electrode to the first semiconductor layer in the ON state.

Although the main current is controlled by the control electrode, no channel is present. For this reason, an increase in ON state voltage caused by a channel resistance can be prevented to improve the ON state characteristics. In addition, no diffusion layer is required in a basic arrangement, so that the problem of an increase in manufacturing time can be solved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3 to 11 are cross sectional views respectively showing semiconductor devices according to other embodiments of the present invention;

FIGS. 13 and 14 are cross sectional views taken along the line XIII—XIII and the line XIV—XIV, respectively, in FIG. 12;

FIGS. 16 and 17 are cross sectional views taken along the line XVI—XVI and the line XVII—XVII, respectively, in FIG. 15;

FIGS. 18 to 31 are cross sectional views respectively showing semiconductor devices according to still other embodiments of the present invention;

FIG. 35 is a plan view showing a detailed structure of the semiconductor device shown in FIG. 31;

FIGS. 36A and 36B are cross sectional views taken along the line S1—S1 and the line S2—S2, respectively, in FIG. 35;

FIG. 37 is a cross sectional view showing a conventional power MOSFET;

FIG. 38 is a cross sectional view showing a semiconductor device according to still another embodiment of the present invention;

FIGS. 46A to 46C are cross sectional views showing, in the order, a method of forming the lower part of the semiconductor device shown in FIG. 45;

FIGS. 47 and 48 are cross sectional views respectively showing semiconductor devices according to still other embodiments of the present invention;

FIGS. 52A to 52E are cross sectional views showing, in the order, a method of forming the upper part of a semiconductor device having a p-layer arranged under a trench.

DETAILED DESCRIPTION OF THE PREFERRED EMBODIMENTS

Preferred embodiments of the present invention will be described below with reference to the accompanying drawings.

Figure 1:
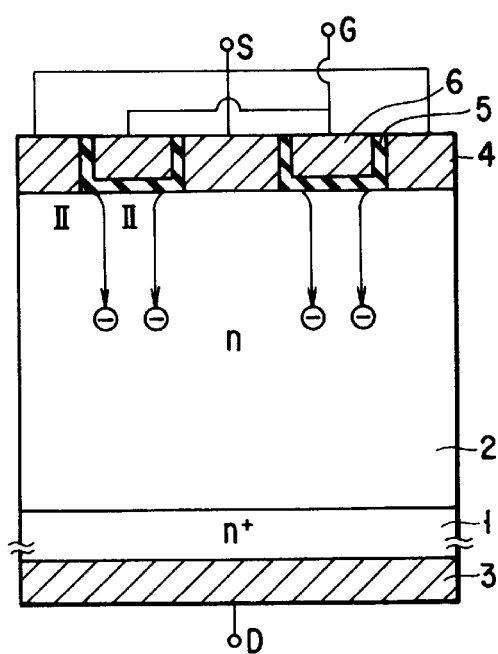
FIG. 1 is a cross sectional view showing a semiconductor device according to an embodiment of the present invention.

FIG. 1 is a cross sectional view showing a semiconductor device according to an embodiment of the present invention.

In FIG. 1, reference numeral 1 denotes a low-resistance n-semiconductor substrate consisting of silicon. A silicon n-semiconductor layer 2 is formed on the n-substrate 1 by epitaxial growth. A source electrode 4 (first main electrode) in the shape of strip, island or annulus forms a Schottky junction with the surface of the n-semiconductor layer 2. Examples of the material of the source electrode 4 are Al, Au, Pt, Ti, and Pd.

A gate electrode 6 in the shape of strip, island or annulus is arranged adjacent to the source electrode 4 on the surface of the n-semiconductor layer 2 through a gate insulating film 5. The gate electrode 6 is insulated from the source electrode 4. A drain electrode 3 (second main electrode) is in ohmic contact with the n-substrate 1.

Figure 2:
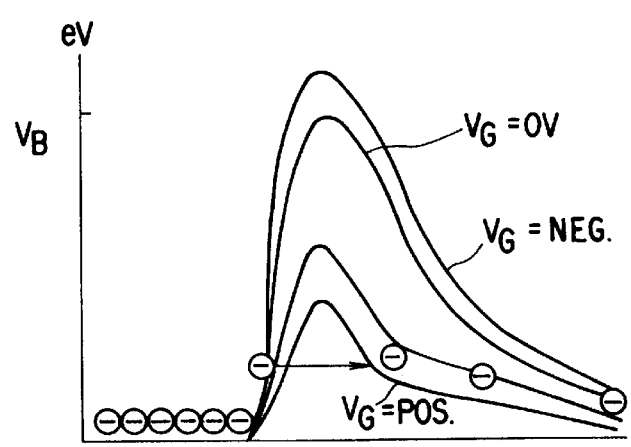
FIG. 2 is a graph showing the potential distribution of the semiconductor device taken along the line II—II in FIG. 1.

FIG. 2 is a graph showing the potential distribution (eV value) of the device taken along the line II—II in FIG. 1.

When a gate voltage $V_G$ of 0 V or a negative value with respect to the source electrode 4 is applied to the gate electrode 6, a sufficiently high Schottky barrier (its level is represented by $V_B$ in FIG. 2) is formed at the interface between the n-semiconductor layer 2 and the source electrode 4. For this reason, even if a predetermined voltage is applied across the drain electrode 3 and the source electrode 4, no electron is injected from the source electrode 4 into the n-semiconductor layer 2, as in a Schottky diode in a reverse bias state.

On the other hand, when a positive gate voltage $V_G$ is applied to the gate electrode 6, the Schottky barrier becomes lower near the gate electrode 6. As shown in FIG. 2, as the gate voltage $V_G$ increases, the Schottky barrier is lowered. When the gate voltage $V_G$ exceeds a predetermined value (threshold voltage), the Schottky barrier height is sufficiently lowered. For this reason, if a predetermined ON state voltage is applied to set the drain electrode 3 to be positive and the source electrode 4 to be negative, a large number of electrons are injected by tunneling through the lowered barrier from the source electrode 4 into the n-semiconductor layer 2 to set the device in a conductive state (ON state).

In this manner, in the semiconductor device shown in FIG. 1, the Schottky barrier height is lowered by applying a positive gate voltage to the gate electrode 6, thereby causing the main current to flow into the device. That is, the main current is switched by controlling the Schottky barrier height with a voltage to be applied to the gate electrode 6.

Although the gate electrode 6 is present in the semiconductor device shown in FIG. 1, a diffusion layer need not be formed in the n-semiconductor layer 2, and generation of a channel need not be controlled for switching the main current, unlike in a MOSFET. Therefore, the problem of an increase in manufacturing time owing to formation of a diffusion layer, and the problem of an increase in ON state voltage owing to a channel resistance do not arise.

As described above, the Schottky barrier height is controlled by the gate voltage in the semiconductor device shown in FIG. 1, so that the amount of main current can be continuously changed as in a MOSFET. Further, since this semiconductor device has no channel resistance, its ON resistance is lower than that in a MOSFET to realize high-speed operation. Therefore, this semiconductor device is effective for an RF device.

Note that, in the semiconductor device shown in FIG. 1, silicon is used as the material of the substrate 1 and the semiconductor layer 2. However, a material such as SiC, CdS, or diamond which has an impurity diffusion coefficient much lower than that of silicon and in which it is difficult to form an impurity diffusion layer can be used because no diffusion layer is required in the device structure according to the present invention.

Since a Schottky junction portion is rendered conductive upon application of a reverse bias across the source and drain, no commutation diode or freewheel diode is required in the assembly of an inverter circuit. In addition, since this diode is a Schottky barrier diode and operates at a high speed as compared to a semiconductor device of the pn-junction type, the performance of an inverter circuit is greatly improved.

Note that, in this embodiment and many embodiments to be described below, the n-semiconductor substrate 1 is arranged below the n-semiconductor layer 2. In this case, the formed device operates like a MOSFET. As shown in FIG. 30, however, the n-semiconductor substrate 1 may be replaced with a p-semiconductor substrate 11. In this case, the formed semiconductor device operates like an IGBT (bipolar transistor with an insulated gate).

Figure 3:
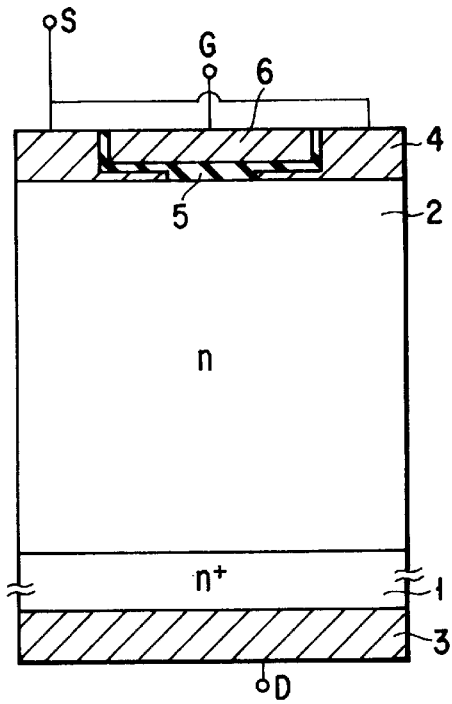

FIG. 3 is a cross sectional view showing a semiconductor device according to another embodiment of the present invention. Note that the same reference numerals as in FIG. 1 denote the same parts in the following embodiments.

The semiconductor device in FIG. 3 is different from that shown in FIG. 1 in that a source electrode 4 and a gate electrode 6 partially overlap each other through a gate insulating film 5. With this structure, even if a gate voltage at the same level as in the preceding embodiment is applied to the gate electrode 6, the Schottky barrier height at the interface between the source electrode 4 and an n-semiconductor layer 2 is further lowered to decrease the ON state voltage.

Since the source electrode 4 at an overlapping portion with the gate electrode 6 is formed to be thin, this thin portion functions as a negative feedback resistor (i.e., a ballast resistor) which is connected in series with the source. When, therefore, a plurality of semiconductor devices are formed, the current distributions of the respective semiconductor devices become uniform.

Note that, in this embodiment, an electric field may be concentrated at the corner (end portion) of the source electrode 4 in the OFF state to increase the leakage current. This phenomenon can be prevented by adjusting the gate voltage to a negative value and reducing the electric field concentrated at the corner of the source electrode 4.

Figure 4:
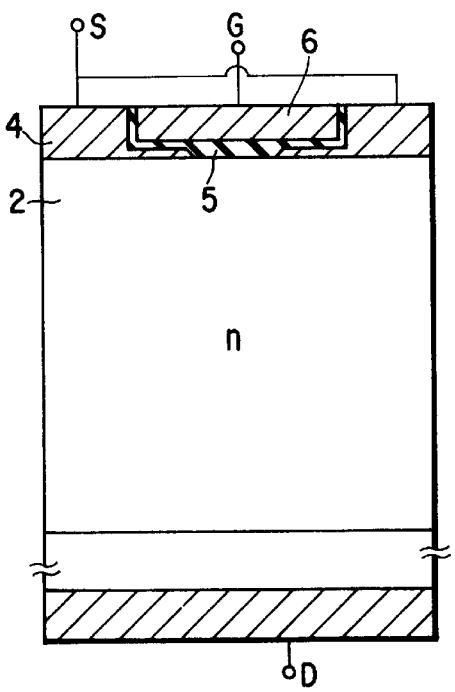

FIG. 4 is a cross sectional view showing a semiconductor device according to still another embodiment of the present invention.

The semiconductor device shown in FIG. 4 is different from that shown in FIG. 3 in that the corner of a source electrode 4 is tapered. With this structure, a high electric field is formed at a thin portion at the distal end of the tapered portion in the ON state, so that electrons can be effectively injected from this distal end portion to further decrease the ON state voltage.

FIG. 5 is a cross sectional view showing a semiconductor device according to still another embodiment of the present invention.

The semiconductor device shown in FIG. 5 is different from that shown in FIG. 4 in that a gate electrode 6 is also tapered to more effectively control the Schottky barrier height with the gate voltage.

FIG. 6 is a cross sectional view showing a semiconductor device according to still another embodiment of the present invention.

The semiconductor device shown in FIG. 6 is different from that shown in FIG. 5 in that the entire corners of a source electrode 4 and a gate electrode 6 are tapered. In the semiconductor device shown in FIG. 6, the same effect can be obtained as in the semiconductor device shown in FIG. 5. The manufacture of the semiconductor device in FIG. 6 is easier than that in FIG. 5 because the shapes of the source electrode 4 and the gate electrode 6 are simplified.

FIG. 7 is a cross sectional view showing a semiconductor device according to still another embodiment of the present invention.

The semiconductor device shown in FIG. 7 is different from that shown in FIG. 3 in that a gate electrode 6 is buried and formed in a trench in the surface of an n-semiconductor layer 2 through a gate insulating film 5.

In the semiconductor device shown in FIG. 7, the gate electrode 6 and a source electrode 4 partially overlap each other through the gate insulating film 5 in the direction of depth of the trench. In the semiconductor device shown in FIG. 7, therefore, the same effect can be obtained as in the semiconductor device shown in FIG. 3.

FIG. 8 is a cross sectional view showing a semiconductor device according to still another embodiment of the present invention.

The semiconductor device shown in FIG. 8 is different from that shown in FIG. 5 in that part of a gate electrode 6 forms a Schottky junction with the surface of an n-semiconductor layer 2. In addition, a resistor R is provided to the gate electrode 6 to prevent a large current from flowing into the device in the OFF state. In this device, no oxide film is required under the gate electrode 6.

Note that it is preferable to select the materials of a source electrode 4 and the gate electrode 6 such that the Schottky barrier of the gate electrode 6 becomes higher than that of the source electrode 4.

Figure 9:
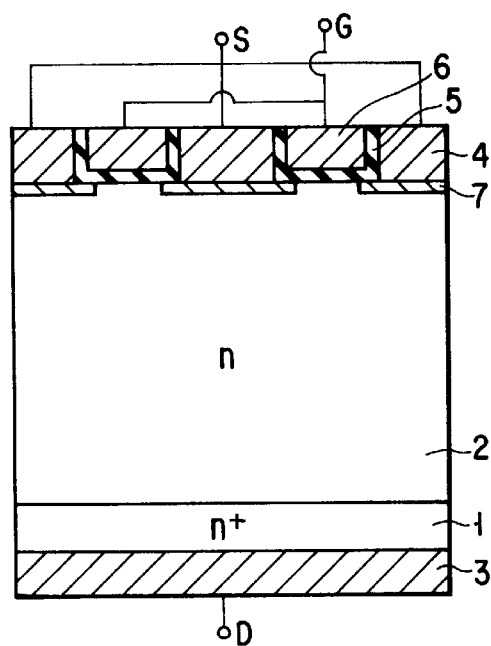

FIG. 9 is a cross sectional view showing a semiconductor device according to still another embodiment of the present invention.

The semiconductor device shown in FIG. 9 is different from that shown in FIG. 1 in that a silicide layer 7 consisting of, e.g., PtSi is arranged at the interface between a source electrode 4 and an n-semiconductor layer 2 to form more stable Schottky junction. It is preferable that the silicide layer 7 and a gate electrode 6 partially overlap each other. The layer 7 may be made of a compound other than silicide where the semiconductor layer 2 is made of a semiconductor other than Si.

Figure 10:
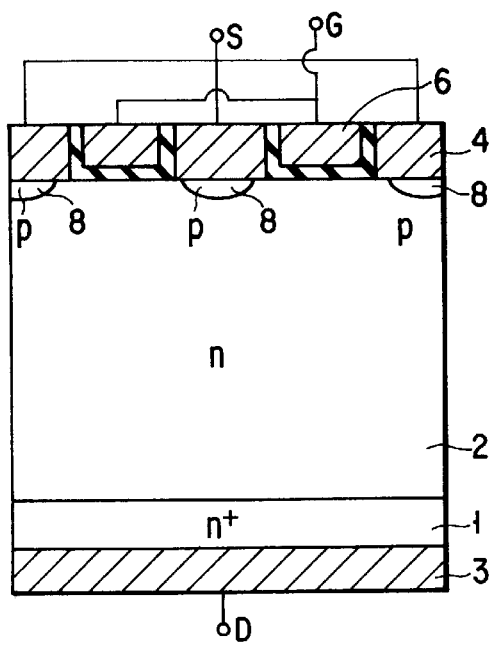

FIG. 10 is a cross sectional view showing a semiconductor device according to still another embodiment of the present invention.

The semiconductor device shown in FIG. 10 is different from that shown in FIG. 1 in that a p-diffusion layer 8 is formed in part of the surface of an n-semiconductor layer 2 in a region where Schottky junction is formed between a source electrode 4 and the n-semiconductor layer 2. The p-diffusion layer 8 may be formed in correspondence with the entire surface of the source electrode 4.

In the semiconductor device shown in FIG. 10, a barrier with respect to electrons is high due to the presence of the p-diffusion layer 8, thereby decreasing the carrier leakage current which flows into the device over the Schottky barrier in the OFF state.

To prevent a malfunction in the OFF state in the semiconductor device shown in FIG. 10, an optimal p-diffusion layer can be formed to set the threshold voltage high. In the case of a high-power device, it is desirable to set the threshold voltage high so as to prevent the device from erroneously operating due to noise.

Figure 11:
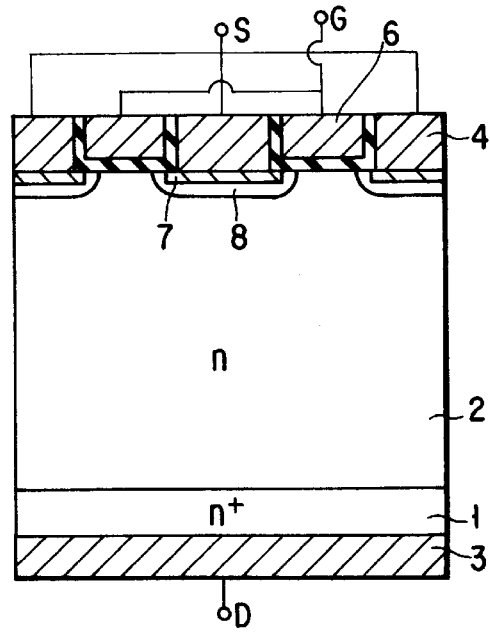

FIG. 11 is a cross sectional view showing a semiconductor device according to still another embodiment of the present invention.

The semiconductor device shown in FIG. 11 is obtained by combining the characteristic features of the semiconductor devices shown in FIGS. 9 and 10. That is, in the semiconductor device shown in FIG. 11, a p-diffusion layer 8 is formed below a gate electrode 4, and a silicide layer 7 which constitutes the Schottky junction is selectively formed on the surface of the p-diffusion layer 8.

Figure 12:
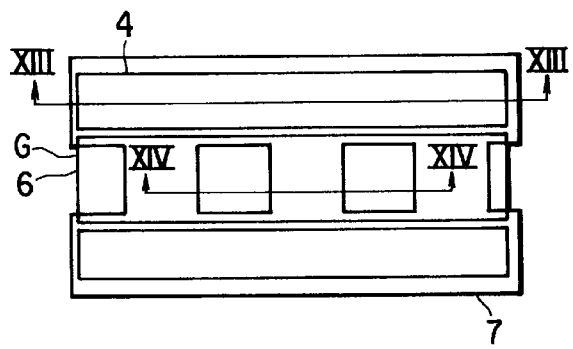
FIG. 12 is a plan view showing a semiconductor device according to still another embodiment of the present invention.

FIG. 12 is a plan view showing a semiconductor device according to still another embodiment of the present invention. FIG. 13 is a cross sectional view taken along the line XIII—XIII in FIG. 12, and FIG. 14 is a cross sectional view taken along the line XIV—XIV in FIG. 12.

In the semiconductor device shown in FIGS. 12 to 14, a silicide layer 7, which is the characteristic feature of the semiconductor device shown in FIG. 9, is formed into a ladder shape. In the semiconductor device shown in FIGS. 12 to 14, electrons are injected from the silicide layer 7 into part of a region where a source electrode 4 is not arranged. An electron-injected portion is enlarged to further decrease the ON state voltage.

Figure 15:
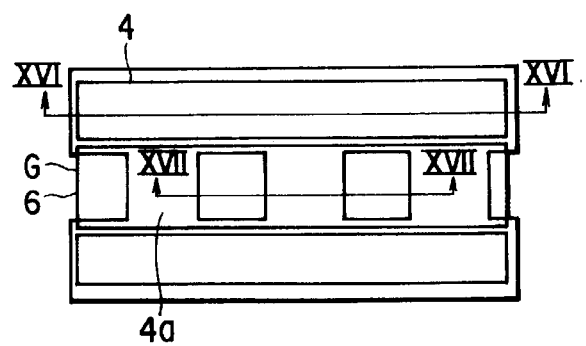
FIG. 15 is a plan view showing a semiconductor device according to still another embodiment of the present invention.

FIG. 15 is a plan view showing a semiconductor device according to still another embodiment of the present invention. FIG. 16 is a cross sectional view taken along the line XVI—XVI in FIG. 15, and FIG. 17 is a cross sectional view taken along the line XVII—XVII in FIG. 15.

In the semiconductor device shown in FIGS. 15 to 17, a source electrode 4a below a gate electrode 6, which is the characteristic feature of the semi-conductor device shown in FIG. 3, is formed into a ladder shape. In the semiconductor device shown in FIGS. 15 to 17, electrons are injected from the source electrode 4a, in a region corresponding to the gate electrode 6. As in the embodiment shown in FIGS. 12 to 14, therefore, an electron-injected portion is enlarged to further decrease the ON state voltage.

Figure 18:
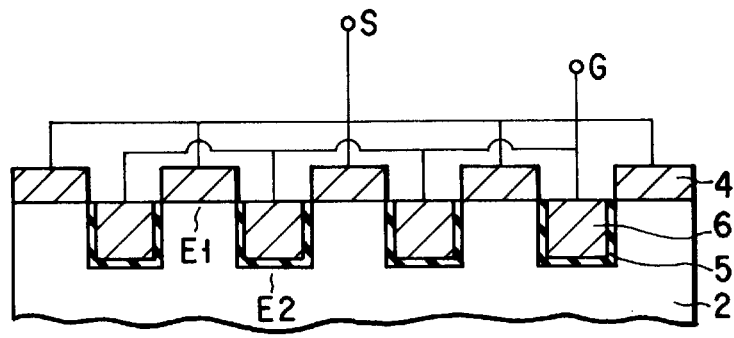

FIG. 18 is a cross sectional view showing a semiconductor device according to still another embodiment of the present invention. Note that an n-semiconductor substrate 1 and a drain electrode 3 are not illustrated in FIG. 18.

The characteristic feature of the semiconductor device shown in FIG. 18 is that a gate electrode is buried in a trench in the surface of an n-semiconductor layer 2 through a gate insulating film 5.

In the semiconductor device shown in FIG. 18, the length of the gate portion which contributes to control of the Schottky barrier height is increased compared to the semiconductor device shown in FIG. 1, thereby further decreasing the ON state voltage.

Figure 19:
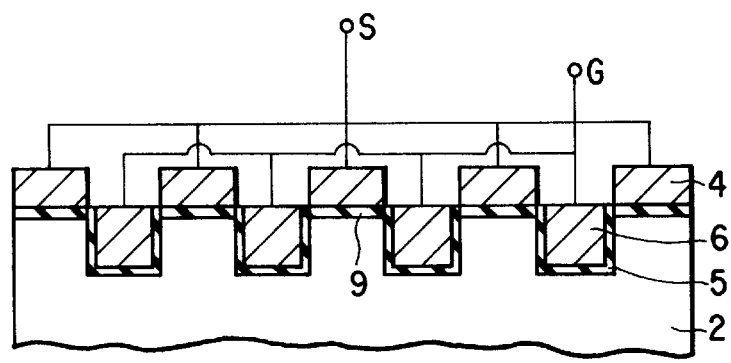

Since the bottom portion of the trench is closer to the drain side than the lower portion (Schottky junction surface) of a source electrode 4, an electric field E1 to be formed, by applying a voltage to the drain electrode 3, on the Schottky junction surface in the OFF state becomes weaker than an electric field E2 to be formed on the bottom portion of the trench. In other words, a strong electric field due to a drain voltage in the OFF state is supported by the bottom portion of the trench, so that the Schottky junction is protected from the strong electric field. Therefore, the carrier leakage current which flows over the Schottky barrier can be decreased. In addition, a higher temperature can be used to a degree attributed to a decreased leakage current, as compared to a conventional device. FIG. 19 is a cross sectional view showing a semiconductor device according to still another embodiment of the present invention.

The semiconductor device shown in FIG. 19 is different from that shown in FIG. 18 in that a thin insulating film (tunnel insulating film) 9 is formed below a source electrode 4. The thickness of the insulating film 9 is set such that a tunneling current can flow between an n-semiconductor layer 2 and the source electrode 4.

In the semiconductor device shown in FIG. 19, the leakage current can be further decreased because electrons flowing as the leakage current have to pass through a barrier of the insulating film as well as the Schottky barrier.

Figure 20:
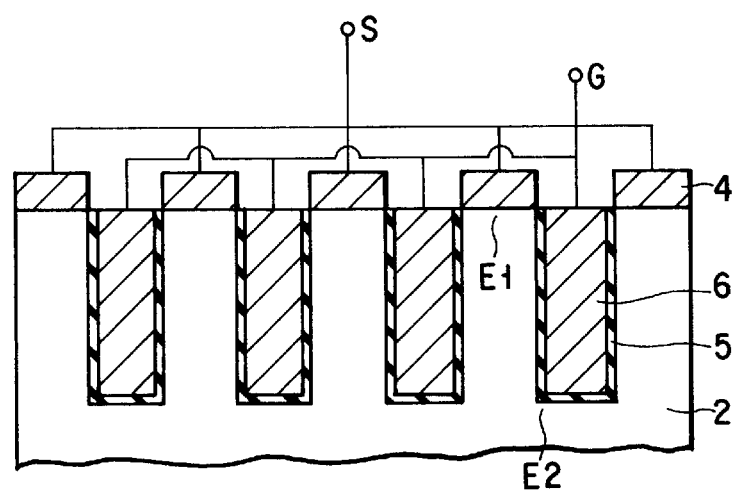

FIG. 20 is a cross sectional view showing a semiconductor device according to still another embodiment of the present invention.

The semiconductor device shown in FIG. 20 is different from that shown in FIG. 18 in that a trench is deeper. In the semiconductor device shown in FIG. 20, an electric field E1 is further weakened to decrease the leakage current and the device can operate at a higher temperature.

Figure 21:
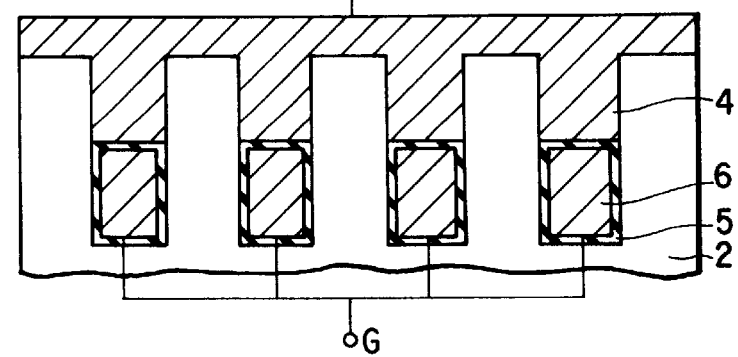

FIG. 21 is a cross sectional view showing a semiconductor device according to still another embodiment of the present invention.

The semiconductor device shown in FIG. 21 is a modification of the semiconductor device shown in FIG. 18 and has a structure in which a source electrode 4 is formed into a trench. With such a structure, the area of the Schottky junction is increased to decrease the ON state voltage when the device operates as a reverse conducting diode.

Note that, in the semiconductor device shown in FIG. 21, the leakage current may increase in the OFF state because of an increase in the area of the Schottky junction. The increase in leakage current can be prevented by forming a deep trench.

FIG. 22 is a cross sectional view showing a semiconductor device according to still another embodiment of the present invention.

The characteristic feature of the semiconductor device shown in FIG. 22 is that a source electrode 4 is formed on the entire surface, and the lower portion of the source electrode 4 and the upper portion of a gate electrode 6 overlap each other through a gate insulating film 5 in the direction of depth of a trench.

In the semiconductor device shown in FIG. 22, the ON state voltage is decreased by employing the trench, as in the semiconductor device shown in FIG. 18. Further, the ON state voltage is decreased because of partial overlap between the source electrode 4 and the gate electrode 6, as in the semiconductor device shown in FIG. 3. In the semiconductor device shown in FIG. 22, therefore, the ON state voltage can be sufficiently decreased, and the switching speed can also be improved. Moreover, a high amplification factor can be obtained when the device is used as an amplification device.

FIG. 23 is a cross sectional view showing a semiconductor device according to still another embodiment of the present invention.

The semiconductor device shown in FIG. 23 is different from that shown in FIG. 1 in that a source electrode 4 and a gate electrode 6 are formed on an n-semiconductor layer 2 through a thin insulating film (tunnel insulating film) 10. The thickness of the insulating film 9 is set such that a tunneling current can flow between an n-semiconductor layer 2 and the source electrode 4.

To turn on the semiconductor device having such an arrangement, a positive DC gate voltage with respect to the source is constantly applied to the gate electrode 6. Note that, to be described later, an AC gate voltage may be applied.

When such a gate voltage is applied to the gate electrode 6, electron-hole pairs are generated in an n-semiconductor layer 2 at a high electric field portion near the source electrode 4 and the gate electrode 6.

Although the electrons flow into the gate electrode 6 through the tunnel insulating film 10 owing to the tunnel effect, the holes are trapped at the interface between the tunnel insulating film 10 and the n-semiconductor layer 2, thereby accumulating positive charges at the interface.

By the accumulated positive charges, an electric field having a certain strength to cause tunneling is formed in the tunnel insulating film 10, and electrons are injected from the source electrode 4 into the n-semiconductor layer 2 through the tunnel insulating film 10 to turn on the device.

On the other hand, to turn off the device, the gate voltage of 0 V or a negative value is applied to the gate electrode 6. As a result, holes trapped at the interface between the tunnel insulating film 10 and the n-semiconductor layer 2 are recombined with the electrons of the n-semiconductor layer 2 and disappear. The injection of electrons from the source electrode 4 is stopped to turn off the device.

Note that, to easily generate electron-hole pairs, a high-resistance p-layer may be formed on the surface of the n-semiconductor layer 2 only below the gate electrode 6 or on the entire surface thereof below the tunnel insulating film 10.

To prevent the device from turning on owing to the leakage current in the OFF state, part of the source electrode 4 may be connected to an n-substrate 1.

The insulating film below the source electrode 4 may be replaced with a semiconductor film having a band gap wider than the semiconductor layer 2. In this case, electrons are injected over the barrier. Although such a semiconductor film having a wide band gap may be used, an insulating film is preferable.

FIG. 24 is a cross sectional view showing a semiconductor device according to still another embodiment of the present invention.

The semiconductor device shown in FIG. 24 has an arrangement in which a low-resistance n-semiconductor substrate 1 of the semiconductor device shown in FIG. 23 is replaced with a low-resistance p-semiconductor substrate 11. This semiconductor device, therefore, operates like an IGBT.

To turn on the device having such an arrangement, a positive DC gate voltage with respect to the source is applied to a gate electrode 6. Once the device is turned on, holes are supplied from the p-substrate 11 to keep the device in the ON state without applying the gate electrode to the gate electrode 6, as in a thyristor.

In the semiconductor device shown in FIG. 24, since both currents, i.e., the electron and hole currents flow in the device in a plasma state or high-injection state, the ON state voltage becomes lower than that in the semiconductor device shown in FIG. 23 in which only the electron current flows.

Note that, in the semiconductor devices shown in FIGS. 23 and 24, a positive DC gate voltage is applied to the gate electrode 6 to turn on the device. Alternatively, an AC gate voltage may be applied.

In this case, holes are accumulated at the interface between the tunnel insulating film 10 and the n-substrate 2 during application of a negative gate voltage. Holes accumulated during application of a positive gate voltage flow into the interface between the tunnel insulating film 10 and the source electrode 4.

As a result, an electric field having a certain strength to cause tunneling is formed in the tunnel insulating film 10, and electrons are injected from the source electrode 4 into the n-semiconductor layer 2 through the tunneling insulating film 10 to turn on the device.

Note that, in the semiconductor device shown in FIG. 23, an AC gate voltage must be constantly applied to keep the ON state, like a MOSFET.

In the semiconductor device, shown in FIG. 24, using the MOS gate electrode 6 for control, the gate electrode 6 may be omitted to form a diode structure. Even in such a case, it is possible to realize a semiconductor device having a low ON state voltage.

Figure 25:
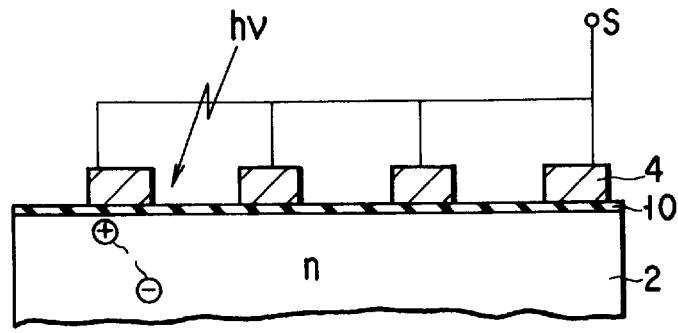

FIG. 25 is a cross sectional view showing a semiconductor device according to still another embodiment of the present invention. Note that either an n-substrate or a p-substrate can be used below an n-semiconductor layer 2.

The characteristic feature of the semiconductor device shown in FIG. 25 is that switching of the device is controlled by light. Therefore, a gate electrode is not used.

To turn on the semiconductor device shown in FIG. 25, light hv having a predetermined energy or more is radiated on an n-semiconductor layer 2 through a tunnel insulating film 10. As a result, electron-hole pairs are generated in the n-semiconductor layer 2. The holes are trapped at the interface between the tunnel insulating film 10 and the n-semiconductor layer 2 to form an electric field having a certain strength to cause tunneling in the tunnel insulating film 10. For this reason, electrons are injected from a source electrode 4 into the n-semiconductor layer 2 through the tunnel insulating film 10 to turn on the device.

In use of an n-substrate below the n-semiconductor layer 2 (in the case of a MOSFET operation), a current flows during irradiation of the light hυ, and the device is turned off by stopping the irradiation of the light hυ.

On the other hand, in use of a p-substrate below the n-semiconductor layer 2 (in the case of an IGBT operation), upon turning on the device, the device is kept in the ON state even if irradiation of the light hυ is stopped.

In the semiconductor devices shown in FIGS. 23 to 25, it is preferable to form the source electrode 4 of n-polysilicon, since it provides an excellent electron-injection.

Figure 26:
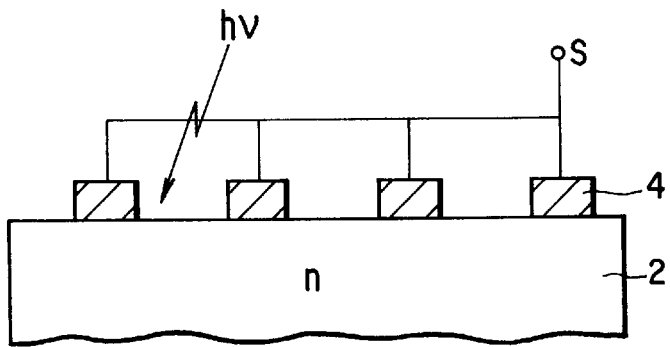

FIG. 26 is a cross sectional view showing a semiconductor device according to still another embodiment of the present invention.

The semiconductor device shown in FIG. 26 is different from that shown in FIG. 25 in that a source electrode 4 forms a Schottky junction with an n-semiconductor layer 2.

To turn on the semiconductor device shown in FIG. 26, light hv having a predetermined energy or more is radiated on the n-semiconductor layer 2. As a result, electron-hole pairs are generated in the n-semiconductor layer 2, and the holes are trapped at the interface between the source electrode 4 and the n-semiconductor layer 2. For this reason, the Schottky barrier height is lowered, and electrons are injected from the source electrode 4 into the n-semiconductor layer 2 to turn on the device.

In use of an n-substrate below the n-semiconductor layer 2 (in the case of a MOSFET operation), a current flows during irradiation of the light hυ, and the device is turned off by stopping the irradiation of the light hυ.

Figure 27:
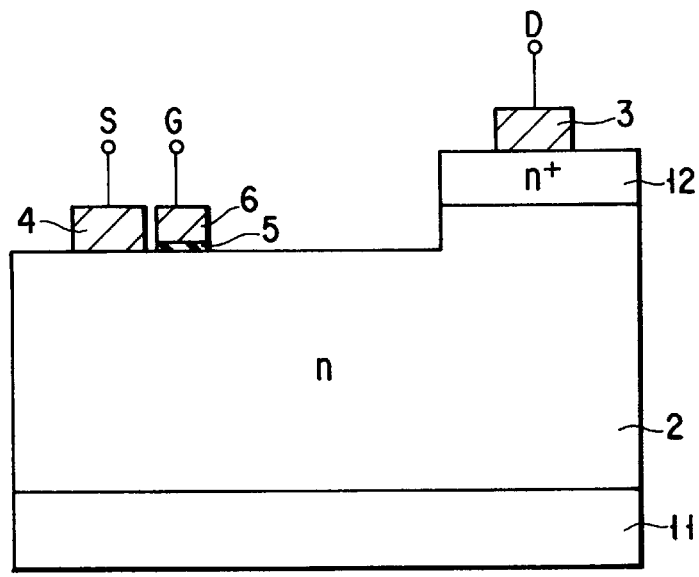

FIG. 27 is a cross sectional view showing a semiconductor device according to still another embodiment of the present invention.

The semiconductor device shown in FIG. 27 is an application example of the present invention to a lateral device. In FIG. 27, reference numeral 11 denotes a silicon semiconductor substrate, and a silicon n-semiconductor layer 2 is arranged on the substrate 11.

A low-resistance n-semiconductor substrate 12 consisting of silicon is formed on the n-semiconductor layer 2. A drain electrode 3 is in ohmic contact with the surface of the n-semiconductor substrate 12. The n-semiconductor substrate 12 is formed by epitaxial growth, so that it is located higher than the remaining portions.

Note that, to facilitate the manufacture, the drain electrode 3 may form a Schottky junction with the surface of the n-semiconductor substrate 12, like the source electrode 4.

Figure 28:
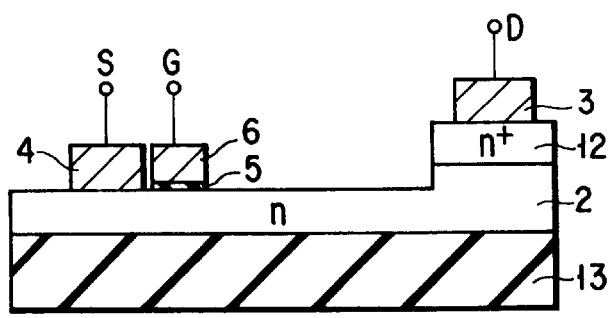

FIG. 28 is a cross sectional view showing a semiconductor device according to still another embodiment of the present invention.

The semiconductor device shown in FIG. 28 is different from that shown in FIG. 27 in that an insulating substrate 13 is used instead of the semiconductor substrate 11; i.e., the semiconductor device is formed on an SOI. Alternatively, a semi-insulating substrate such as a GaAs substrate may be used instead of the insulating substrate 13, and n-semiconductor layers 2 and 12 may be formed by adding an impurity to the semi-insulating substrate such as a GaAs substrate.

FIG. 29 is a cross sectional view showing a semiconductor device according to still another embodiment of the present invention.

The semiconductor device shown in FIG. 29 is different from that shown in FIG. 28 in that a low-resistance n-semiconductor substrate 12 is not used, and a drain electrode 3 forms a Schottky junction with an n-semiconductor layer 2.

FIG. 30 is a cross sectional view showing a semiconductor device according to still another embodiment of the present invention.

The semiconductor device shown in FIG. 30 has an arrangement in which the low-resistance n-semiconductor substrate 1 is replaced with a low-resistance p-semiconductor substrate 11. Therefore, this semiconductor device operates like an IGBT.

To turn on the device having such an arrangement, a positive DC gate voltage with respect to the source is applied to a gate electrode 6.

FIG. 31 is a cross sectional view showing a semiconductor device according to still another embodiment of the present invention.

Figure 32:
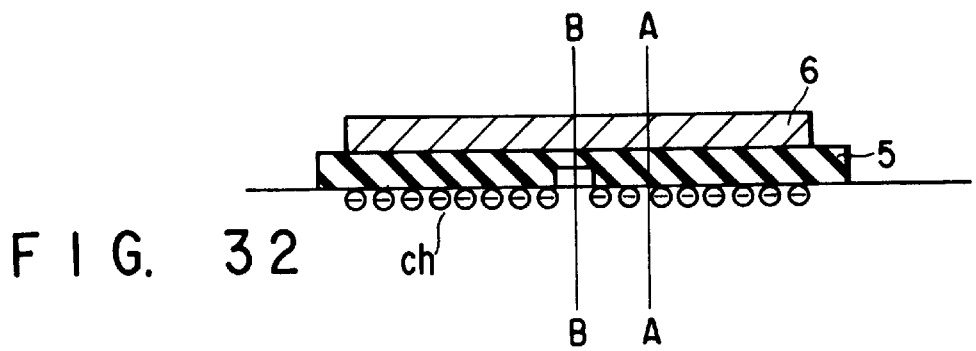
FIG. 32 is a view showing an inversion layer formed when a negative bias voltage is applied to a gate electrode in the blocking state of the semiconductor device shown in FIG. 31.
Figure 33:
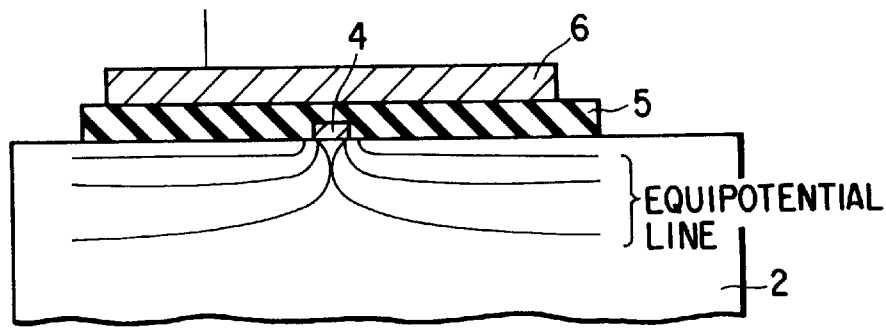
FIG. 33 is a view showing an electric field distribution in the semiconductor shown in FIG. 32.
Figure 34:
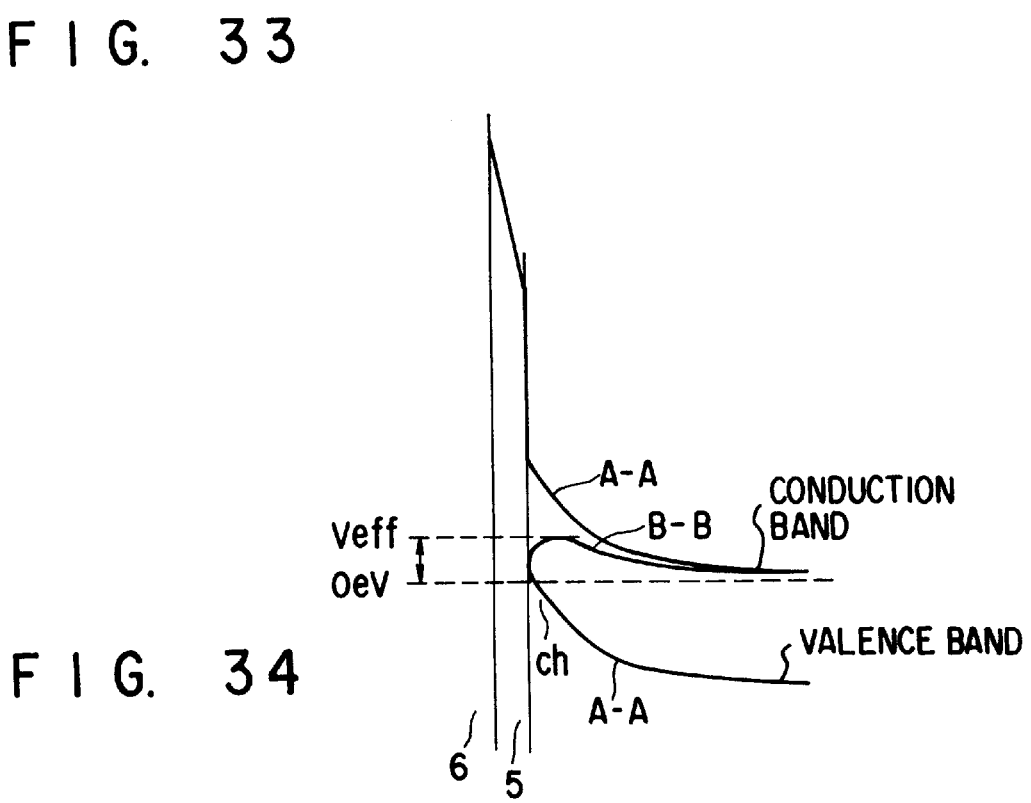
FIG. 34 is a band diagram of the semiconductor shown in FIG. 32.

The semiconductor device shown in FIG. 31 is a modification of the semiconductor devices shown in FIGS. 12 to 14 and FIGS. 15 to 17. The characteristic feature of the semiconductor device shown in FIG. 31 is that a narrow source electrode 4 is formed. When a negative bias voltage is applied to a gate electrode 6 in the blocking state, an inversion layer ch is formed immediately near the source electrode 4, as shown in FIG. 32. The inversion layer ch operates as a p-base layer of an SIT, and a current is pinched off below the source electrode 4, as indicated by equipotential lines in FIG. 33. FIG. 34 is a band diagram at this time. Injection of electrons from the source electrode 4 is completely blocked by this pinch-off.

The effect of the semiconductor device shown in FIG. 31 is as follows. That is, even if the Schottky barrier height of the source electrode 4 is small, a current is pinched off below the source electrode 4 owing to the inversion layer ch formed by the gate bias. A barrier height Veff substantially increases (FIG. 34) to realize the complete blocking state. In an extreme case, the source electrode 4 need not form a Schottky junction with the n-semiconductor layer 2.

To turn on the semiconductor device shown in FIG. 31, a voltage to be applied to the gate electrode is increased, or a positive voltage is applied, and electrons are injected from the source electrode, as in other embodiments.

FIG. 35 is a plan view showing a detailed structure of the semiconductor device shown in FIGS. 31 to 34, and FIGS. 36A and 36B are sectional views taken along the lines S1—S1 and S2—S2, respectively, in FIG. 35. As shown in FIG. 35, the source electrode 4 becomes narrow at only a portion under a gate electrode 6 in a basic arrangement.

FIG. 38 is a cross sectional view showing a semiconductor device according to still another embodiment of the present invention.

In this semiconductor device, an n-semiconductor substrate 1 consists of SiC, and an SiC n-semiconductor layer 2 is formed thereon by epitaxial growth. A drain electrode 3 is in ohmic contact with the surface of the n-semiconductor substrate 1.

A source electrode 4 forms a Schottky junction with the surface of the n-semiconductor layer 2. A gate electrode 6 is arranged adjacent to the source electrode 4 on the n-semiconductor layer 2 through an insulating film 5 (e.g., a thermal oxide film). A preferable thickness of the gate insulating film 5 at the MOS structure portion is 100 nm or less. An insulating interlevel layer 17 is arranged to cover the gate electrode 6, and an Al layer 18 which functions as part of a source electro de and a wiring layer is arranged thereon.

A method of forming the upper portion of the semiconductor device shown in FIG. 38 will be described with reference to FIGS. 39A to 39D.

Figure 39A:
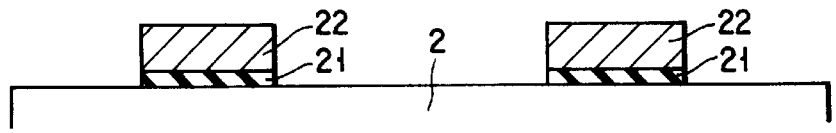
FIGS. 39A to 39D are cross sectional views showing, in the order, a method of forming the upper part of the semiconductor device shown in FIG. 38.
Figure 39B:
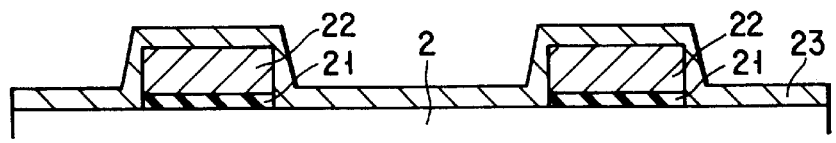

First of all, a gate insulating film 21 is formed by thermal oxidation, and a gate electrode 22 consisting of p- or n-doped polysilicon is selectively deposited thereon by CVD. The thermal oxide film except for that at the gate portion is removed (FIG. 39A). A mixed film 23 made of a mixture of Ti or Pt and Si is formed by co-sputtering (FIG. 39B).

Figure 39C:
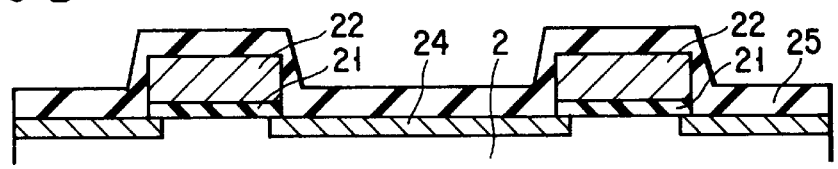
Figure 39D:
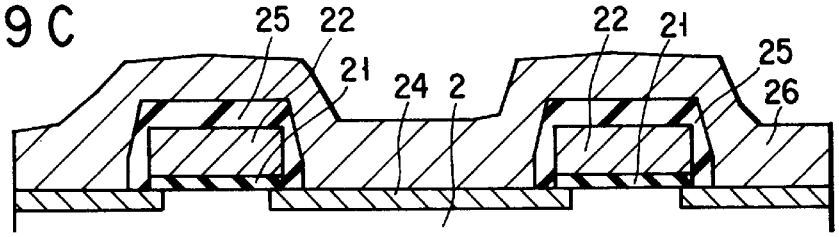

Next, a silicide layer 24 is formed by heat treatment, i.e., sintering. The mixed film 23 is oxidized and removed. An insulating film 25 consisting of a silicon oxide film is formed by CVD (FIG. 39C). The insulating film 25 is patterned such that the portion which covers the gate electrode 22 remains, and an Al layer 26 for wiring is formed (FIG. 39D).

According to this method, the device is formed in a self-aligned manner, and the Schottky electrode 4 (silicide layer 24) is also formed below the gate insulating film 5. For this reason, the Schottky barrier height can be effectively controlled by the gate voltage to improve the controllability of the gate voltage with respect to the main current. A preferable height of the step of a silicide boundary portion is 0.2 $\mu$m or less. Further, if the thickness is 50 nm or less, a decrease in yield owing to the step portion of the insulating film can be prevented.

Another method of forming the upper portion of the semiconductor device shown in FIG. 38 will be described below with reference to FIGS. 40A to 40E.

Figure 40A:
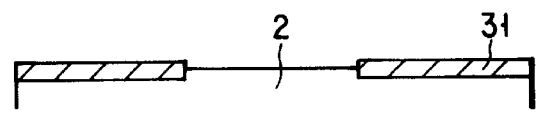
FIGS. 40A to 40E are cross sectional views showing, in the order, another method of forming the upper part of the semiconductor device shown in FIG. 38.
Figure 40B:
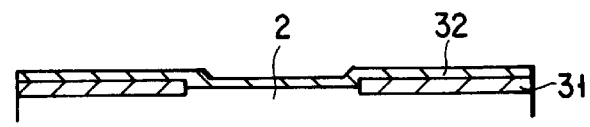
Figure 40C:
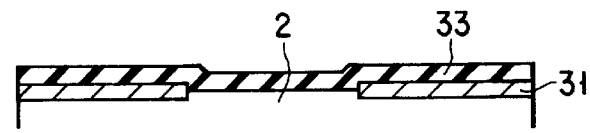

First of all, a silicide layer 31 is selectively formed on the surface of the SiC semiconductor layer 2 (FIG. 40A). A polysilicon film 32 is deposited on the surfaces of the silicide layer 31 and the semiconductor layer 2 (FIG. 40B). The polysilicon film 32 is thermally oxidized to form an insulating film 33 (FIG. 40C).

At this time, the semiconductor (SiC) layer 2 may also be oxidized. If the semiconductor layer 2 is oxidized prior to deposition of the polysilicon film 32, a step between the semiconductor layer 2 and the silicide layer 31 can be eliminated to avoid poor step coverage and the like in oxidizing the polysilicon film 32.

Figure 40D:
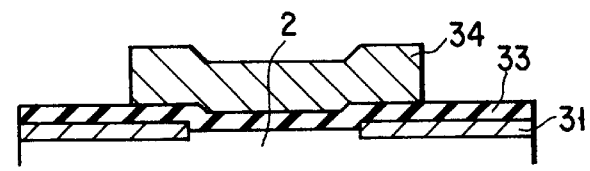
Figure 40E:
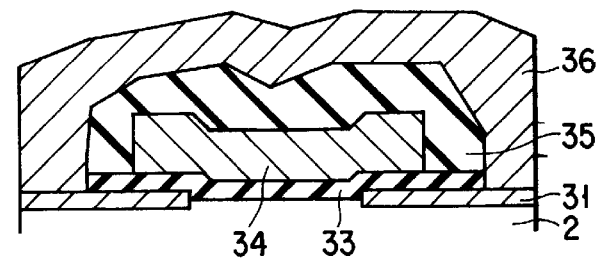

Next, a gate electrode 34 consisting of heavily doped polysilicon is selectively formed on the insulating film 33 (FIG. 40D). An insulating interlevel layer 35 consisting of a silicon oxide film is formed by CVD. The insulating films 33 and 35 are removed on the silicide layer 31, and an Al layer 36 for wiring is formed to contact the silicide layer 31 (FIG. 40E).

According to this method, the overlapping portion between the Schottky junction portion (silicide layer 31) of the source electrode 4 and the gate electrode 6 is increased to improve the controllability of the gate with respect to the Schottky barrier.

Still another method of forming the upper portion of the semiconductor device shown in FIG. 38 will be described below with reference to FIGS. 41A to 41E.

Figure 41A:
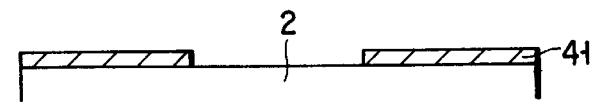
FIGS. 41A to 41E are cross sectional views showing, in the order, still another method of forming the upper part of the semiconductor device shown in FIG. 38.
Figure 41B:
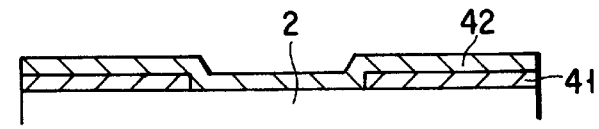
Figure 41C:
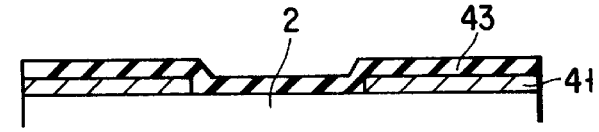

First of all, a thin Schottky metal film 41 is selectively formed on the surface of the SiC semiconductor layer 2 (FIG. 41A). A polysilicon film 42 is deposited on the surfaces of the thin metal film 41 and the semiconductor layer 2 (FIG. 41B). The polysilicon film 42 is thermally oxidized to form an insulating film 43 (FIG. 41C).

At this time, the surface of the semiconductor (SiC) layer 2 may also be oxidized. If the semiconductor layer 2 is oxidized prior to deposition of the polysilicon film 42, a step between the semiconductor layer 2 and the thin Schottky metal film 41 can be eliminated to avoid poor step coverage and the like in oxidizing the polysilicon film 42.

Figure 41D:
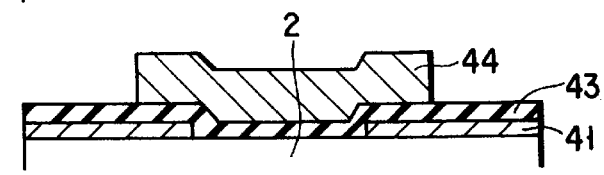
Figure 41E:
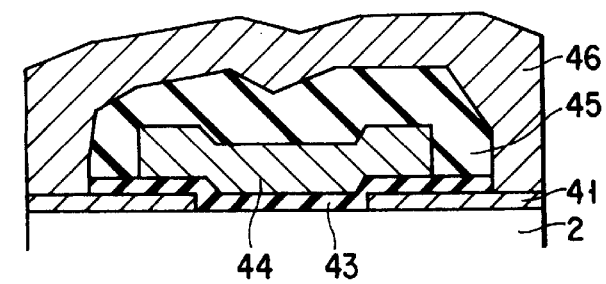

Next, a gate electrode 44 consisting of heavily doped polysilicon is selectively formed on the insulating film 43 (FIG. 41D). An insulating interlevel layer 45 consisting of a silicon oxide film is formed by CVD. The insulating films 43 and 45 are removed on the thin Schottky metal film 41, and an Al layer 46 for wiring is formed to contact the thin metal film 41 (FIG. 41E).

According to this method, the overlapping portion between the Schottky junction portion (Schottky metal film 41) of the source electrode 4 and the gate electrode 6 is increased to improve the controllability of the gate with respect to the Schottky barrier.

Note that a preferable thickness of the thin metal film 41 is 0.2 $\mu$m or less. Further, if the thickness is 50 nm or less, a decrease in yield owing to the step portion of the insulating film can be prevented. To decrease the ON state voltage, it can be considered that Ti is used as the material of the thin metal film 41, and the thin metal film 41 is brought into contact with the Al electrode. On the other hand, from the viewpoint of the leakage current and the cutoff ability, it is desirable to use Ni or Au as the material of the thin metal film 41. In addition, a mixed film made of a mixture of Al and any one of Ti, Ni, and Au may be used as the material of the thin metal film 41. Particularly, if Al : Ti is 1:1 or less, the Schottky barrier is sufficiently high, and the barrier height is rarely lowered, so that a device having a high cutoff ability can be formed. Furthermore, if the thickness of the thin metal film 41 is set to be of 20 atomic layers or less, a resistor is inserted in series in an electron injection portion, and the current variation between cells can be reduced.

Figure 42:
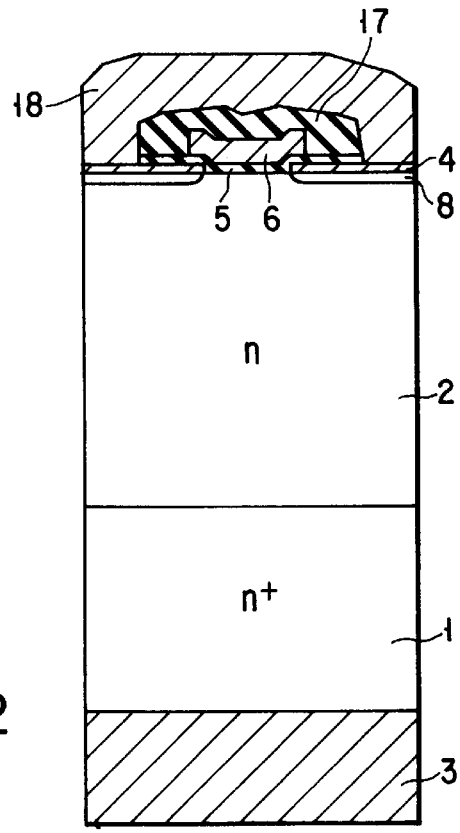
FIG. 42 is a cross sectional view showing a semiconductor device according to still another embodiment of the present invention.

FIG. 42 is a cross sectional view showing a semiconductor device according to still another embodiment of the present invention.

The semiconductor device shown in FIG. 42 is different from that shown in FIG. 38 in that a p-layer 8 (see FIG. 11) for increasing the breakdown voltage is formed on the surface of an n-semiconductor layer 2. The carrier concentration of the p-layer 8 is set to be $1 \times 10^{17}$ /cm$^3$ or less.

A method of forming the upper portion of the semiconductor device shown in FIG. 42 will be described with reference to FIGS. 43A to 43E. This method is a partial modification of the method shown in FIGS. 39A to 39D.

Figure 43A:
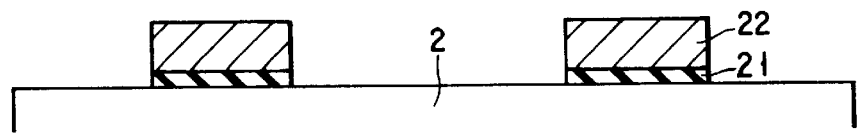
FIGS. 43A to 43E are cross sectional views showing, in the order, a method of forming the upper part of the semiconductor device shown in FIG. 42.
Figure 43B:
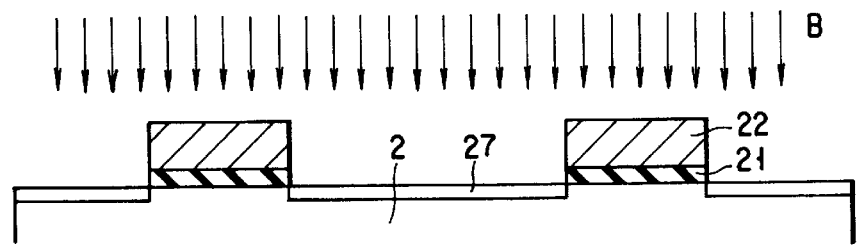
Figure 43C:
Figure 43D:
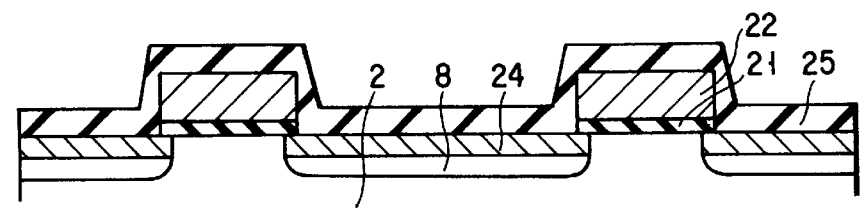

First of all, a gate insulating film 21 is formed by thermal oxidation, and a gate electrode 22 consisting of p- or n-doped polysilicon is selectively deposited thereon by CVD. The thermal oxide film except for that at the gate portion is removed (FIG. 43A). Boron ions are implanted in the surface of the semiconductor layer 2 using the gate electrode 22 as a mask to form a boron-implanted layer 27 (FIG. 43B). A mixed film 23 made of a mixture of Ti or Pt and Si is formed by co-sputtering (FIG. 43C).

Next, a silicide layer 24 is formed by heat treatment, i.e., sintering. At the same time, the boron in the boron-implanted layer 27 is diffused to form the p-layer 8. The mixed film 23 is oxidized and removed. An insulating film 25 consisting of a silicon oxide film is formed by CVD (FIG.

Figure 43E:
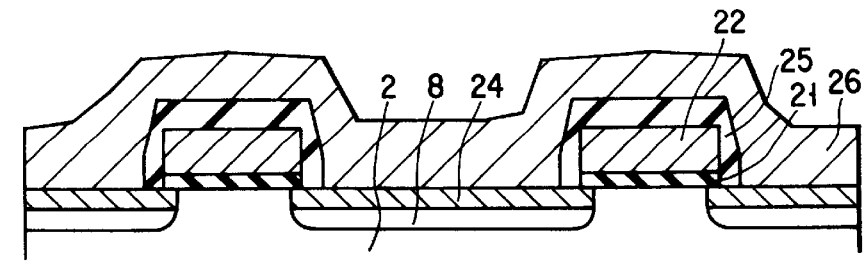

43D). The insulating film 25 except for that at the gate portion is removed, and an Al layer 26 for wiring is formed (FIG. 43E).

According to this method, the device is formed in a self-aligned manner, and the Schottky electrode 4 (silicide layer 24) is also formed below a gate insulating film 5. For this reason, the Schottky barrier height can be effectively controlled by the gate voltage to improve the controllability of the gate voltage with respect to the main current. In addition, the leakage current can be decreased in the forward blocking state by forming the p-layer 8.

Figure 44A:
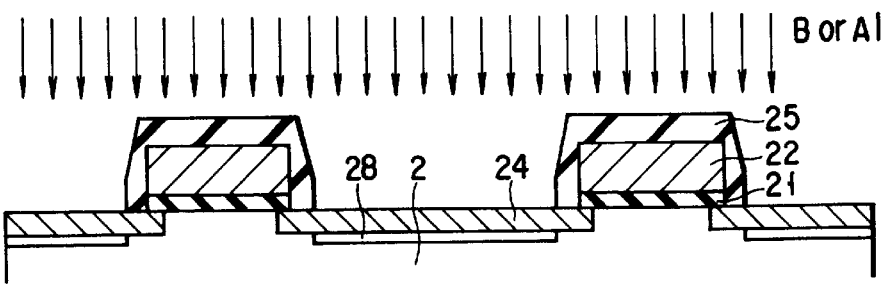
FIGS. 44A to 44C are cross sectional views showing, in the order, another method of forming the upper part of the semiconductor device shown in FIG. 42.
Figure 44B:
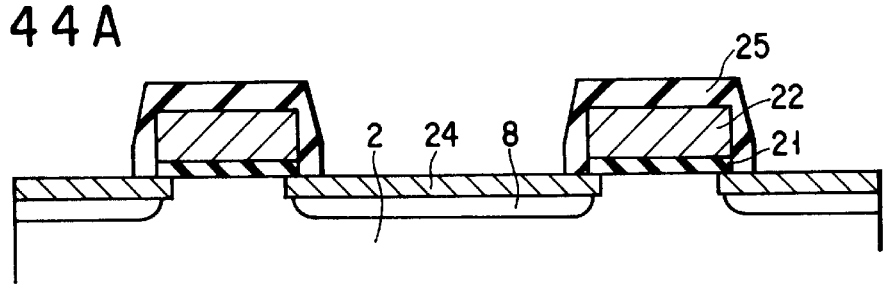
Figure 44C:
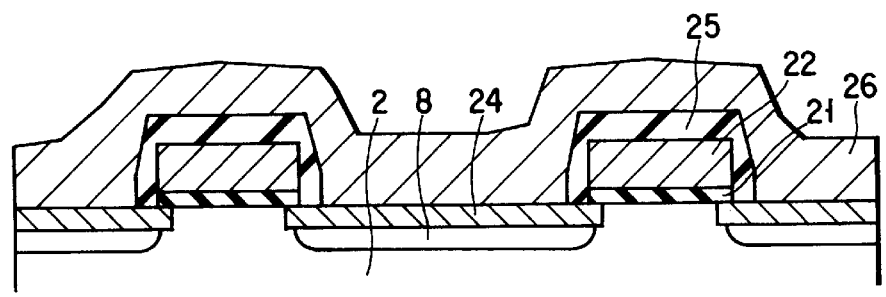

Still another method of forming the upper portion in the device structure of the semiconductor device shown in FIG. 38 will be described below with reference to FIGS. 44A to 44C. The method shown in FIGS. 44A to 44C can be performed subsequent to the step shown in FIG. 39C.

First of all, an insulating film 25 is patterned in the structure shown in FIG. 39C such that the portion which covers a gate electrode 22 remains. Boron ions are implanted in the surface of the semiconductor layer 2 through a silicide layer 24 by using the gate electrode 22 as a mask to form a boron-implanted layer 28 (FIG. 44A). The boron in the boron-implanted layer 28 is diffused by heat treatment to form a p-layer 8 (FIG. 44B). Then, an Al layer 26 for wiring is formed (FIG. 44C).

According to this method, degradation caused by an implanted impurity, e.g., boron can be prevented in forming the silicide layer 24.

Figure 45:
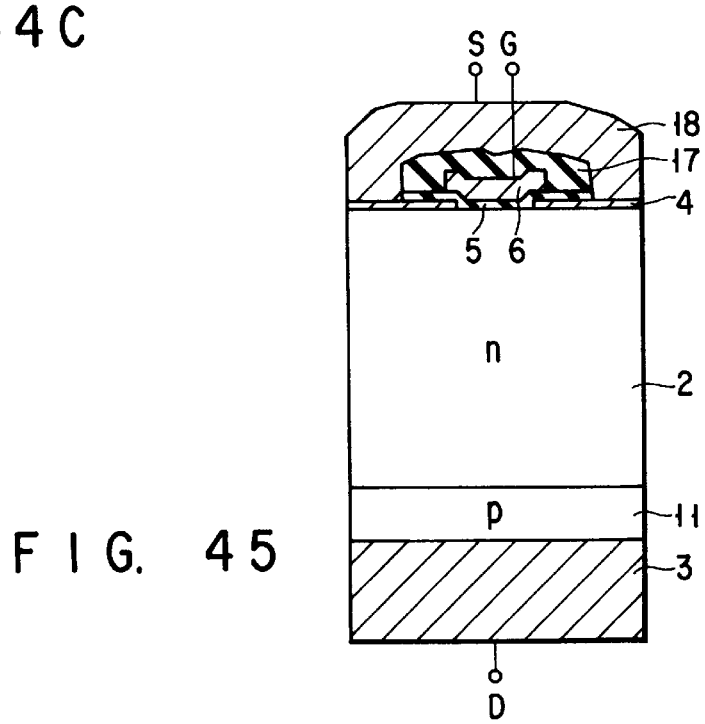
FIG. 45 is a cross sectional view showing a semiconductor device according to still another embodiment of the present invention.

FIG. 45 is a cross sectional view showing a semiconductor device according to still another embodiment of the present invention.

In the semiconductor device shown in FIG. 45, a low-resistance p-layer 11 (see FIG. 30) is arranged on the anode side of an SiC n-semiconductor layer 2. This semiconductor device, therefore, operates like an IGBT. When a positive potential with respect to an electrode 4 is applied to a gate electrode 6, the Schottky barrier height of the electrode 4 is lowered below the gate electrode 6, and electrons are injected into the n-semiconductor layer 2. The injected electrons reach the p-layer (emitter layer) 11 on the anode side, and the barrier height between the p-layer 11 and the n-layer 2 is lowered to promote injection of holes from the p-layer 11. In this manner, the device executes a bipolar operation.

A method of forming the p-layer (emitter layer) 11 on the anode side of the semiconductor device shown in FIG. 45 will be described with reference to FIGS. 46A to 46C.

First of all, one or both of silicon and germanium ions are implanted in the lower surface of the n-semiconductor layer 2 (e.g., an SiC substrate) (FIG. 46A), and boron ions are also implanted (FIG. 46B). An Al electrode 3 is arranged on the implanted layer on the lower surface of the n-semiconductor layer 2 (FIG. 46C).

By implanting silicon or germanium, the boron easily enters in a crystal and activated. Further, ohmic contact of the electrode 3 can be easily formed. As a result, the boron-implanted layer serves as a p-layer (emitter layer) to realize the device which can execute a bipolar operation.

FIG. 47 is a cross sectional view showing a semiconductor device according to still another embodiment of the present invention.

An SiC n-semiconductor layer 2 is formed on an SiC $n^+$-substrate 1 (or a p-substrate 11) by epitaxial growth. A drain electrode 3 is brought into ohmic contact with the surface of the substrate 1. A trench is selectively formed in the surface of the semiconductor layer 2, and a gate electrode 6 is formed in the trench through an insulating film 5 (e.g., a thermal oxide film). In the case of a thermal oxide film, a preferable thickness of the gate insulating film 5 is 100 nm or less. The upper surface of the semiconductor layer 2 except for that in the trench contacts a source electrode 4. It is preferable to realize Schottky junction at the interface between the semiconductor layer 2 and the source electrode 4.

FIG. 48 is a cross sectional view showing a semiconductor device according to still another embodiment of the present invention.

The semiconductor device shown in FIG. 48 is different from that shown in FIG. 47 in that an $n^+$-layer 16 is formed on the surface of an n-semiconductor layer 2, and a source electrode 4 is in ohmic contact with the $n^+$-layer 16.

Figure 49:
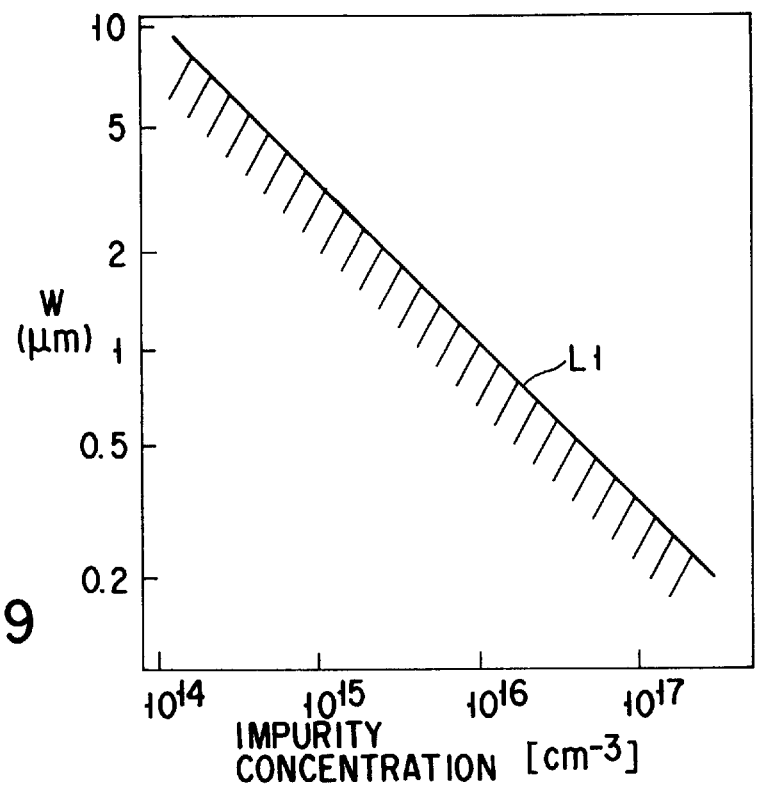
FIG. 49 is a graph showing the relationship between a bulk width between trenches and the impurity concentration thereof in the semiconductor device shown in FIG. 48.
Figure 50:
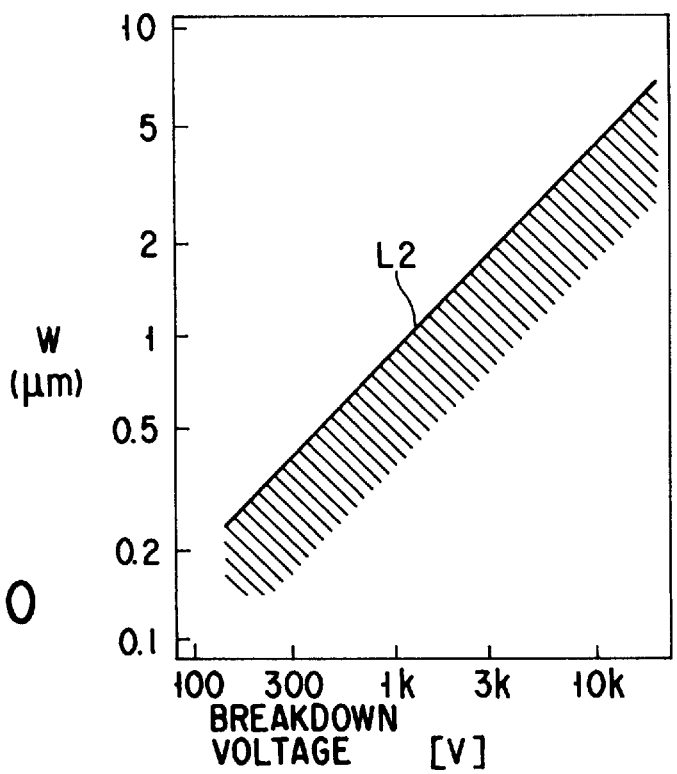
FIG. 50 is a graph showing the relationship between the bulk width between trenches and the breakdown voltage of the semiconductor device shown in FIG. 48.

FIG. 49 is a graph showing the relationship between a bulk width W (FIG. 48) between trenches and the impurity concentration of the SiC layer 2 in the semiconductor device shown in FIG. 48 when the ratio of OFF/ON resistances is set to have four digits ($10^4$) or more. FIG. 50 is a graph showing the relationship between the bulk width W and the breakdown voltage of the device, which is obtained on the basis of the above condition in FIG. 49. In the graphs, a hatched side with respect to each of limiting lines L1 and L2 is a range where the condition is satisfied. That is, the switching characteristics are poor, and the leakage current increases when the condition falls outside this range.

The graphs shown in FIGS. 49 and 50 represent the case using striped trenches. When trenches are formed to surround a bulk portion, the effect of the gate potential for the bulk portion is doubled, and thus the same effect as described above can be obtained even if the width W has values twice as large as the values shown in the graphs.

As shown in FIG. 47, when the source electrode 4 forms a Schottky junction with the n-semiconductor layer 2, switching can be performed even if the width W is large. Taking the effect of a decrease in leakage current into consideration, however, the width W preferably has values about or less than three to four times as large as the values shown in the graphs. When the barrier height is small owing to an imperfect Schottky junction, or the barrier height is greatly lowered by the drain voltage (the ideal factor is much larger than 1), the width W preferably has the values shown in the graphs.

A method of forming the upper portion of a semiconductor device having a gate electrode 6 arranged in a trench will be described below with reference to FIGS. 51A to 51F.

Figure 51A:
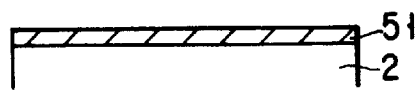
FIGS. 51A to 51F are cross sectional views showing, in the order, a method of forming the upper part of a semiconductor device having a gate electrode arranged in a trench.
Figure 51B:
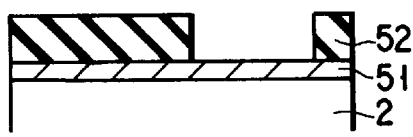
Figure 51C:
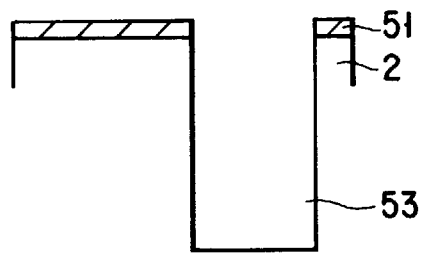

First of all, a mixed film 51 of Ti and Si is formed on an SiC n-semiconductor layer 2 by co-sputtering (FIG. 51A). An oxide film 52 which will serve as a mask for trench RIE is selectively formed thereon by CVD (FIG. 51B). A trench 53 is formed in the SiC n-semiconductor layer 2 by RIE, and the oxide film 52 is removed (FIG. 51C).

Figure 51D:
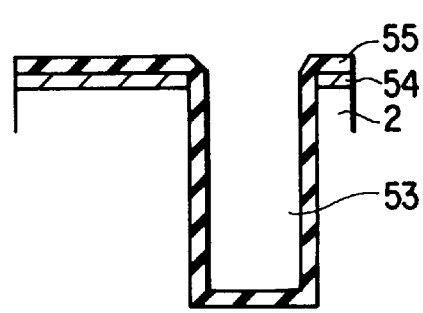
Figure 51E:
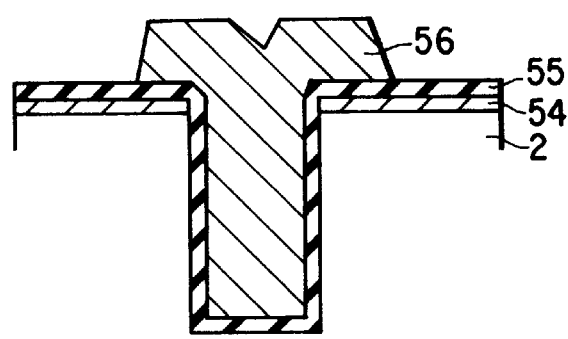

Next, the mixed film 51 of Ti and Si is silicified by heat treatment (sintering) to form a silicide layer 54. At the same time, the side wall of the trench 53 is oxidized to form a gate insulating film 55 (FIG. 51D). Doped polysilicon is buried in the trench 53 to obtain a buried gate electrode 56 (FIG. 51E).

Figure 51F:
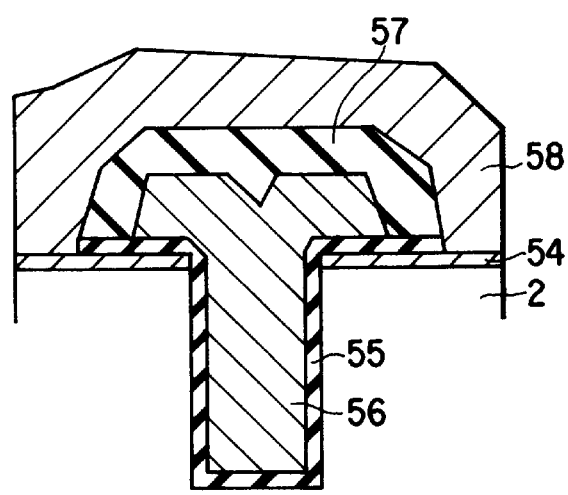

An insulating interlevel layer 57 consisting of a silicon oxide film is formed by CVD. The insulating films 55 and 57 are removed on the silicide layer 54, and an Al layer 58 for wiring is formed to contact the silicide layer 54 (FIG. 51F).

The method shown in FIGS. 51A to 51F can be modified as follows.

First, the mixed film 51 of Ti and Si is formed on the semiconductor layer 2 by co-sputtering (FIG. 51A). The mixed film 51 of Ti and Si is silicified by heat treatment (sintering) to form the silicide layer 54. The oxide film 52 which will serve as a mask for trench RIE is selectively formed thereon by CVD (FIG. 51B). The trench 53 is formed in the semiconductor layer 2 by RIE, and the oxide film 52 is removed (FIG. 51C).

A polysilicon film is formed on the surfaces of the trench 53 and the silicide layer 54 and oxidized to obtain the gate insulating film 55. In this case, oxidation is performed up to the surface of the semiconductor layer 2. That is, the gate insulating film 55 is formed of the polysilicon oxide film and the SiC oxide film.

The method of performing oxidization up to the surface of the SiC layer 2 in oxidizing the polysilicon film to obtain the gate insulating film 55, i.e., the method of forming the gate insulating film 55 of the polysilicon oxide film and the SiC oxide film can be applied to not only a trench device but also the above-described planar device. The method of forming the trench 53 after forming the Schottky electrode 4 (silicide layer 54) can be directly applied to the case using a thin metal film as the Schottky electrode 4.

A method of forming the upper portion of a semiconductor device having a p-layer 8 arranged below a trench will be described below with reference to FIGS. 52A to 52E. This method is a partial modification of the method shown in FIGS. 51A to 51F.

After forming a trench 53, boron ions are implanted in an SiC layer 2 below the trench 53 through the trench 53 to form an implanted layer 61 (FIG. 52C). The boron in the implanted layer 61 is diffused by subsequent heat treatment to form the p-layer 8 below the trench 53. The remaining steps are the same as in the method shown in FIGS. 51A to 51F.

The above-described semiconductor devices according to the embodiments of the present invention are effective for a power device and an RF device, and also for a memory cell switching device.

Note that the present invention is not limited to the above embodiments. For example, when a p-substrate is used instead of the n-substrate, a semiconductor device operates like an IGBT. In addition, the characteristic features of the vertical devices according to the embodiments can be applied to lateral devices. Various changes and modifications are deemed to lie within the spirit and scope of the invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a first semiconductor layer of a first conductivity type having a flat common surface;

a first main electrode arranged on said flat common surface to form a Schottky junction with said first semiconductor layer;

a second main electrode connected to said first semiconductor layer; and a control electrode arranged adjacent to the Schottky junction so as to oppose said first semiconductor layer through an insulating film arranged on said flat common surface, said control electrode being configured to control a Schottky barrier height at a portion of the Schottky junction corresponding to an edge of the first main electrode, wherein, when the Schottky barrier height is lowered at said edge by a turn on voltage on the control electrode while applying a voltage across said first and second main electrodes, said device is turned on and a current flows between said first and second main electrodes through said first semiconductor layer, wherein a first interface forming said Schottky junction between said first main electrode and said first semiconductor layer, and a second interface between said insulating film and said first semiconductor layer are arranged on the same plane on said flat common surface, and wherein said first main electrode comprises an extending portion interposed between said control electrode and said first main semiconductor layer, and said Schottky junction is formed by said extending portion.

2. The device according to claim 1, wherein said extending portion consists of a thin metal film having a thickness of not more than 0.2 μm.

3. The device according to claim 1, wherein the first conductivity type is an n type.

4. The device according to claim 1, further comprising a second semiconductor layer of the first conductivity type having a low resistance and arranged on said first semiconductor layer, wherein said second main electrode is in ohmic contact with said second semiconductor layer.

5. The device according to claim 1, further comprising a second semiconductor layer of a second conductivity type having a low resistance and arranged on said first semiconductor layer, wherein said second main electrode is in ohmic contact with said second semiconductor layer.

6. The device according to claim 1, wherein electrons are injected into said first semiconductor layer from said edge when the Schottky barrier height is lowered.

7. The device according to claim 1, wherein said extending portion is tapered towards its distal end.

8. The device according to claim 1, wherein said first semiconductor layer consists of a material selected from a group consisting of SiC, CdS, and diamond.

9. The device according to claim 1, wherein said extending portion is narrower than said control electrode such that, when the Schottky barrier height is raised by turn off voltage, a current path below said extending portion is pinched off by an inversion layer of a second conductivity type which is induced in said first semiconductor layer upon application of said turn off voltage to said control electrode.

* * * * *